(12) United States Patent
Umezawa

(10) Patent No.: US 10,056,153 B2
(45) Date of Patent: Aug. 21, 2018

(54) SEMICONDUCTOR DEVICE AND OPERATING METHOD OF SAME

(71) Applicant: Toshiba Memory Corporation, Minato-ku (JP)

(72) Inventor: Yusuke Umezawa, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/696,348

(22) Filed: Sep. 6, 2017

(65) Prior Publication Data

US 2018/0151235 A1 May 31, 2018

(30) Foreign Application Priority Data

Nov. 25, 2016 (JP) ................................. 2016-229016

(51) Int. Cl.
*G11C 11/34* (2006.01)
*G11C 16/34* (2006.01)
*G11C 16/08* (2006.01)
*H01L 27/11578* (2017.01)
*G11C 16/04* (2006.01)
*G11C 16/14* (2006.01)

(52) U.S. Cl.
CPC ...... *G11C 16/3436* (2013.01); *G11C 16/0466* (2013.01); *G11C 16/08* (2013.01); *G11C 16/14* (2013.01); *H01L 27/11578* (2013.01)

(58) Field of Classification Search
CPC . G11C 16/3436; G11C 16/0466; G11C 16/08; G11C 16/14; H01L 27/11578

USPC ....................................................... 365/185.24
See application file for complete search history.

(56) References Cited

U.S. PATENT DOCUMENTS

2011/0103153 A1* 5/2011 Katsumata ......... G11C 16/0466
365/185.23
2016/0141011 A1* 5/2016 Lee .......................... G11C 7/14
365/201

FOREIGN PATENT DOCUMENTS

JP 2011-096340 5/2011

* cited by examiner

*Primary Examiner* — Fernando Hidalgo
(74) *Attorney, Agent, or Firm* — Oblon, McClelland, Maier & Neustadt, L.L.P.

(57) ABSTRACT

A semiconductor device according to an embodiment includes first and second memory cells, a first word line, and first and second bit lines. The first memory cell has a first gate electrode and a first channel. The second memory cell has a second gate electrode and a second channel. The first word line connected with each of the first and second gate electrodes. The first and second bit lines electrically connected with the first and second channels, respectively. The semiconductor device erases data of each of the first and second memory cells, and then shifts respective threshold voltages of the first and second memory cells while making a first voltage between the first gate electrode and the first channel, and a second voltage between the second gate electrode and the second channel. The first voltage is different from the second voltage.

14 Claims, 16 Drawing Sheets

SEMICONDUCTOR DEVICE AND OPERATING METHOD OF SAME

CROSS-REFERENCE TO RELATED APPLICATIONS

This application is based upon and claims the benefit of priority from Japanese Patent Application No. 2016-229016, filed on Nov. 25, 2016; the entire contents of which are incorporated herein by reference.

FIELD

Embodiments described herein relate generally to a semiconductor device and an operating method of the same.

BACKGROUND

In high-integration rewritable nonvolatile semiconductor memory devices, the high integration of the memory cells has been promoted using microfabrication technologies and three-dimensional structuring technologies to thereby increase the storage capacity. Meanwhile, processing variation due to the miniaturization and the three-dimensional structuring has been actualized to affect the performance and the operational stability of the memory cells.

There has been known the fact that weak program is performed after erasing data to control the threshold voltage of the erased data. In the case of performing such weak program, it is also necessary to suppress the variation in the threshold voltage caused by the variation in structure of the memory cells.

DETAILED DESCRIPTION

Figure 1:
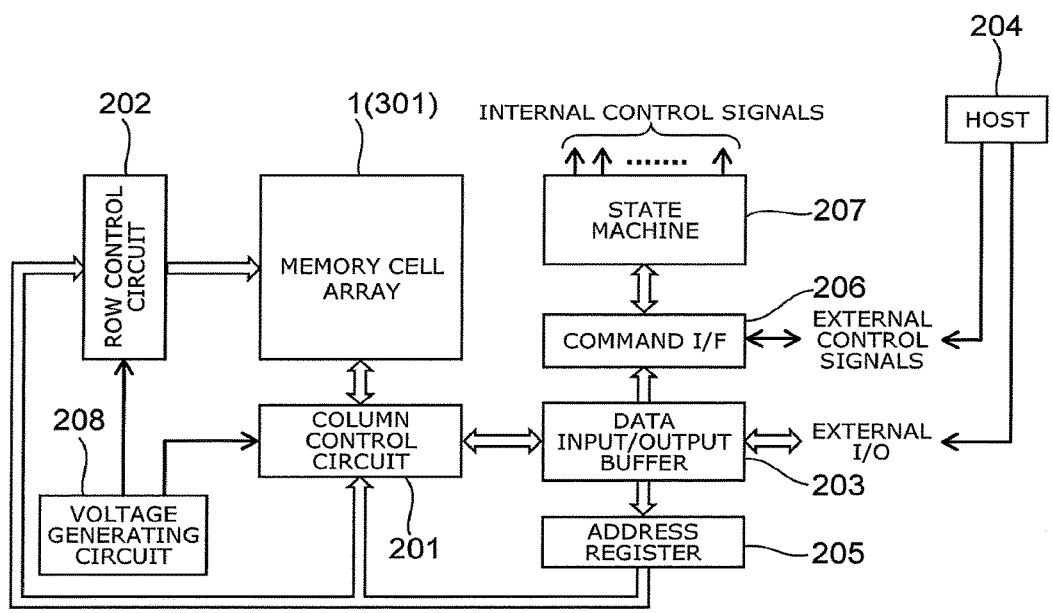
FIG. 1 is a schematic block diagram of the semiconductor device of the first embodiment.

A semiconductor device according to an embodiment includes a first memory cell, a second memory cell, a first word line, a first bit line, a second bit line, a source line, and a row control circuit. The first memory cell has a first gate electrode, and a first channel having one end and another end. The second memory cell has a second gate electrode, and a second channel having one end and another end. The first word line electrically connected with each of the first gate electrode and the second gate electrode. The first bit line electrically connected with the one end of the first channel. The second bit line electrically connected with the one end of the second channel. The source line electrically connected with each of the other end of the first channel and the other end of the second channel. The row control circuit adapted to supply the first word line with a voltage. The semiconductor device erases data of each of the first memory cell and the second memory cell, and then shifts respective threshold voltages of the first memory cell and the second memory cell while making a first voltage between the first gate electrode and the first channel, and a second voltage between the second gate electrode and the second channel. The first voltage is different from the second voltage.

A semiconductor device according to another embodiment includes a first memory cell, a second memory cell, a first word line, a first bit line, a second bit line, a source line, a row control circuit, a column control circuit, and a state machine. The first memory cell has a first gate electrode, and a first channel having one end and the other end. The second memory cell has a second gate electrode, and a second channel having one end and the other end. The first word line is connected with each of the first gate electrode and the second gate electrode. The first bit line is electrically connected with the one end of the first channel. The second bit line is electrically connected with the one end of the second channel. The source line is electrically connected with each of the other end of the first channel and the other end of the second channel. The row control circuit includes a row driver connected with the first word line. The column control circuit includes a first circuit connected with the first bit line, and a second circuit connected with the second bit line. The first circuit includes a first driver and a compensation voltage generating circuit connected in series between a power supply voltage and the ground potential. An output of the first driver is connected with the first bit line, and an output of the compensation voltage generating circuit is connected with a ground potential-side power supply terminal of the first driver. The state machine is configured to execute an operation of erasing the data of each of the first memory cell and the second memory cell, and then shifting the respective threshold voltages of the first memory cell and the second memory cell while making a first voltage between the first gate electrode and the channel and a second voltage between the second gate electrode and the second channel. The first voltage is different from the second voltage.

An operating method of a semiconductor device according to still another embodiment is an operating method of the semiconductor device according to the embodiment. The operating method includes a first procedure and a second procedure. In the first procedure, the data of each of the first memory cell and the second memory cell is erased. In the second procedure, the respective threshold voltages of the first memory cell and the second memory cell are shifted while making the first voltage between the first gate electrode and the first channel and the second voltage between the second gate electrode and the second channel. The first voltage is different from the second voltage.

The embodiment will hereinafter be described with reference to the drawings. It should be noted that in the drawings, the same elements are denoted by the same reference symbols. The semiconductor device according to the embodiment is a semiconductor memory device having a memory cell array.

First Embodiment

FIG. 1 is a schematic block diagram of the semiconductor device of the first embodiment.

As shown in FIG. 1, the semiconductor device includes a memory cell array 1. The memory cell array 1 is provided with, for example, bit lines BL, word lines WL, source lines SL, drain-side selection transistors STD, memory cells MC, and source-side selection transistor STS.

On the periphery of the memory cell array 1, there are provided a column control circuit 201 and a row control circuit 202. The column control circuit 201 controls the potentials of the bit line BL and the source line SL to perform erasing of data from the memory cells MC, programming of data to the memory cells MC, and reading of data from the memory cells MC.

The row control circuit 202 selects the word line WL and provides the gate electrodes of the drain-side selection transistors STD, the memory cells MC, and the source-side selection transistors STS with the potentials necessary for erasing the data from the memory cells MC, programming the data to the memory cells MC, and reading the data from the memory cells MC.

A data input/output buffer 203 receives external I/O data from a host 204 in the outside. The data input/output buffer 203 performs receiving of program data, receiving of command data, receiving of address data, and output of read data to the outside.

The data input/output buffer 203 sends the program data having been received to the column control circuit 201. The column control circuit 201 sends the read data from the memory cell array 1 to the data input/output buffer 203. The data input/output buffer 203 outputs the read data having been received to the outside.

The data input/output buffer 203 sends the address data having been received to an address register 205. The address register 205 sends the address data having been received to the column control circuit 201 and the row control circuit 202.

The command interface (command I/F) 206 receives an external control signal from the host 204. The command I/F 206 determines whether the data received by the input/output buffer 203 is the program data, the command data or the address data based on the external control signal having been received. If the data having been received by the data input/output buffer 203 is the command data, the command I/F 206 sends the data to the state machine 207 as a command signal.

The state machine 207 manages the overall operation of the semiconductor device. The state machine 207 receives the command data from the host 204 via the command I/F 206, and then outputs an internal control signal. Thus, the state machine 207 performs, for example, program, reading, erasing, and the management of input/output of the data. A voltage generating circuit 208 generates internal voltages necessary for a program operation, a reading operation, and an erasing operation based on the internal control signal. The state machine 207 manages status information. The status information can also be sent to the host 204. Due to the reception of the status information, the host 204 can make a judgment on the operation status and the operation result of the semiconductor device.

Figure 2:
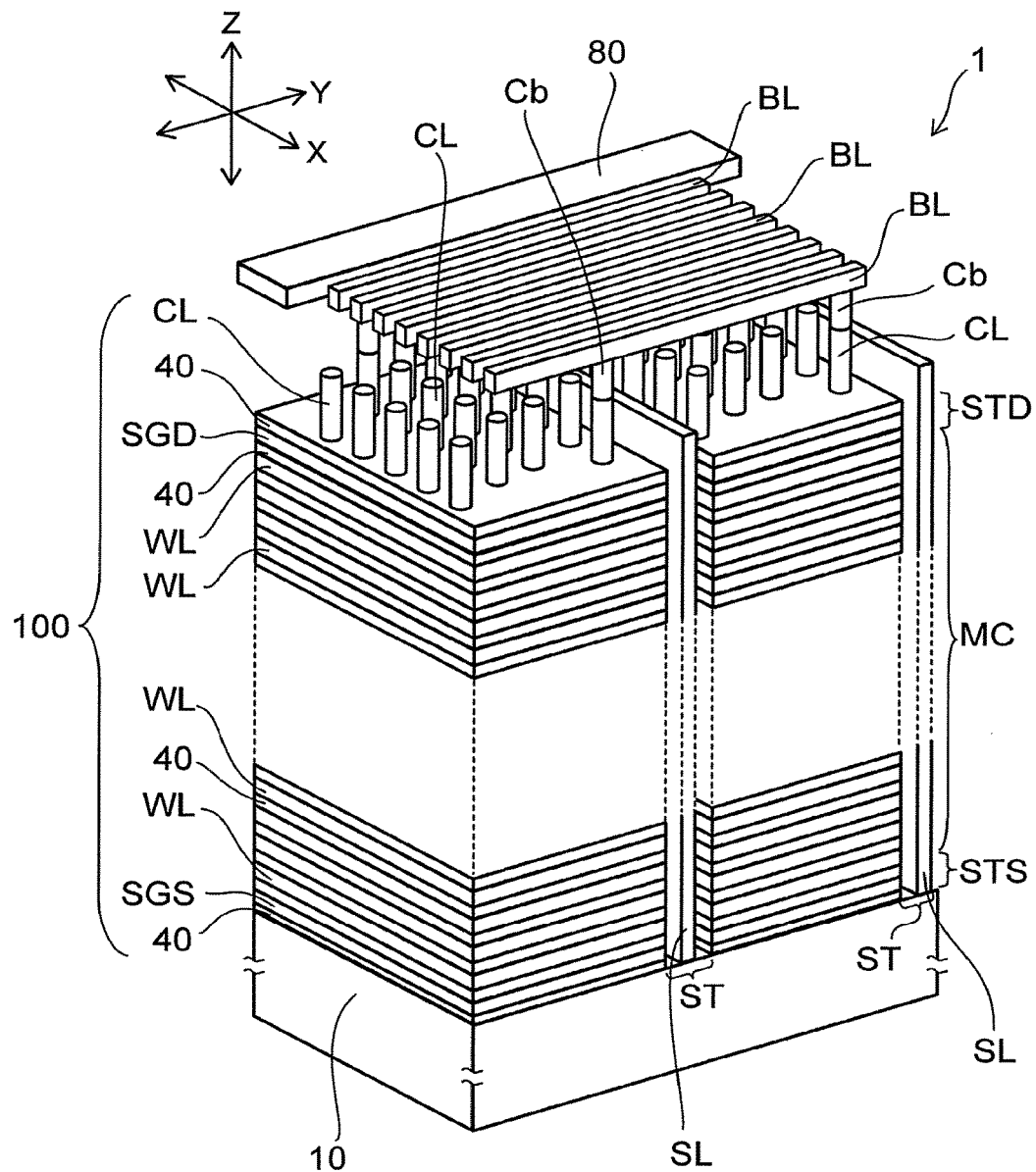
FIG. 2 is a schematic perspective view of the memory cell array of the semiconductor device of the first embodiment.

FIG. 2 is a schematic perspective view of the memory cell array 1 of the semiconductor device of the first embodiment.

As shown in FIG. 2, the memory cell array 1 has a stacked body 100. The stacked body 100 is provided with a plurality of slits ST and a plurality of columnar sections CL.

Source-side selection gates SGS are provided on a substrate 10. The substrate 10 is, for example, a semiconductor substrate. The semiconductor substrate includes, for example, silicon. The plurality of word lines WL is provided on respective source-side selection gates SGS. Drain-side selection gates SGD are provided on the plurality of word lines WL. The drain-side selection gate SGD, the word lines WL, and the source-side selection gate SGS are each an electrode layer. The number of electrode layers stacked is arbitrary.

The electrode layers (SGD, WL, SGS) are stacked separately from each other. Between the electrode layers (SGD, WL, SGS), there are disposed insulators 40. The insulators 40 each can also be an insulator such as a silicon oxide film, or can also be an air gap. The stacked body 100 includes the insulators 40 and the electrode layers (SGD, WL, SGS) alternately.

The drain-side selection transistor STD uses at least one of the drain-side selection gates SGD as a gate electrode. The source-side selection transistor STS uses at least one of the source-side selection gates SGS as a gate electrode. Between the drain-side selection transistor STD and the source-side selection transistor STS, the memory cells MC are connected in series to each other. The memory cells MC each use one of the word lines WL as a gate electrode. The structure having the drain-side selection transistor STD, the plurality of memory cells MC, and the source-side selection transistor STS connected in series to each other is called a "memory string."

The slit ST extends through the stacked body 100 in the stacking direction (the Z-direction) and the X-direction. The slits ST separate the stacked body 100 into a plurality of regions in the Y-direction. The regions separated by the slits ST are each called a "block."

In each of the slits ST, there is disposed a source line SL. The source line SL is a conductive body. The source line SL is isolated from the stacked body 100, and extends in, for example, the Z-direction and the X-direction to form a plate-like shape. Above the source line SL, there is disposed an upper-layer interconnection 80. The upper-layer interconnection 80 extends in the Y-direction. The upper-layer interconnection 80 is electrically connected with the source lines SL arranged along the Y-direction.

The columnar sections CL are provided in the stacked bodies 100 separated by the slits ST from each other. The columnar sections CL each extend in the stacking direction (the Z-direction). The columnar sections CL each penetrate the word lines, and are each formed to have, for example, a cylindrical shape or an elliptic cylindrical shape. The columnar sections CL are disposed in the memory cell array 1 to form, for example, a staggered arrangement lattice or a square lattice. The drain-side selection transistor STD, the plurality of memory cells MC, and the source-side selection transistor STS are disposed in each of the columnar sections CL.

Above the upper end parts of the columnar sections CL, there is disposed a plurality of bit lines BL. The bit lines BL each extend in the Y-direction. An upper end part of each of the columnar sections CL is electrically connected with one of the bit lines BL via a contact part Cb. One bit line BL is electrically connected with the columnar sections CL selected singly from the respective blocks.

Figure 3:
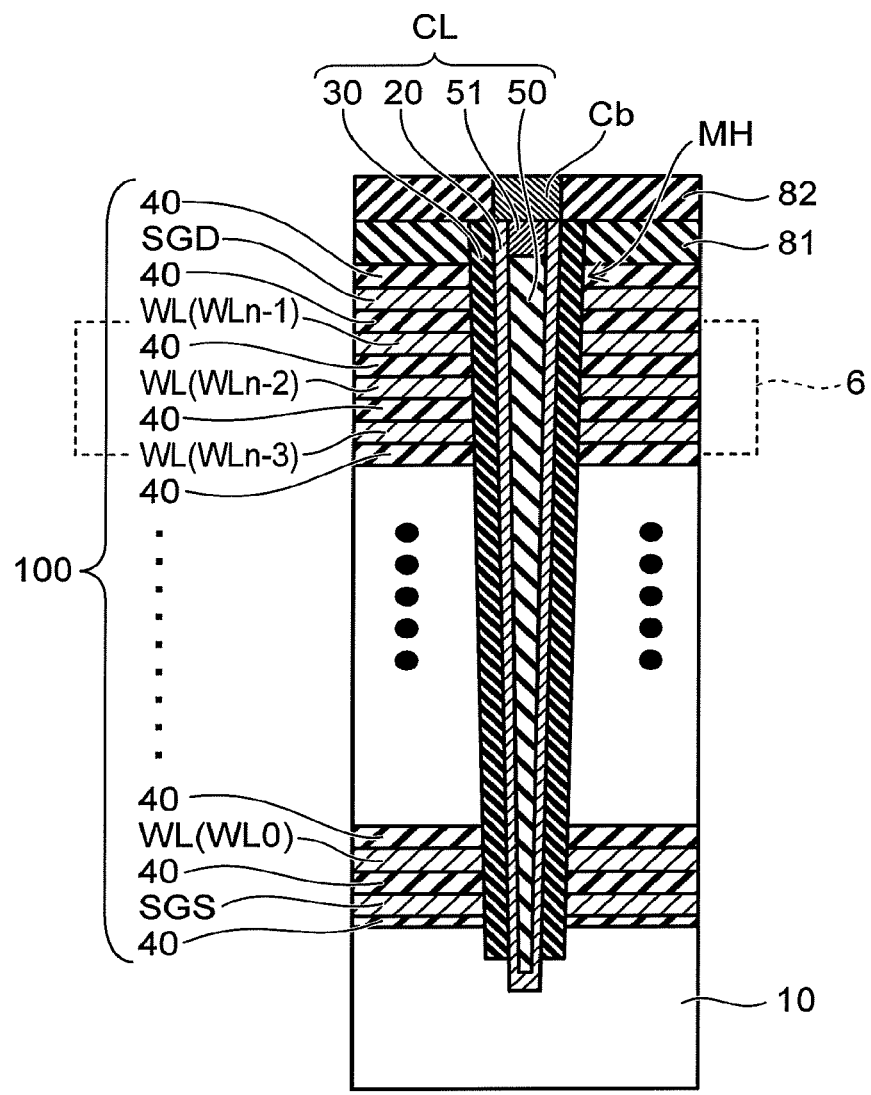
FIG. 3 is a schematic cross-sectional view of each of the columnar sections of the semiconductor device of the first embodiment.
Figure 4:
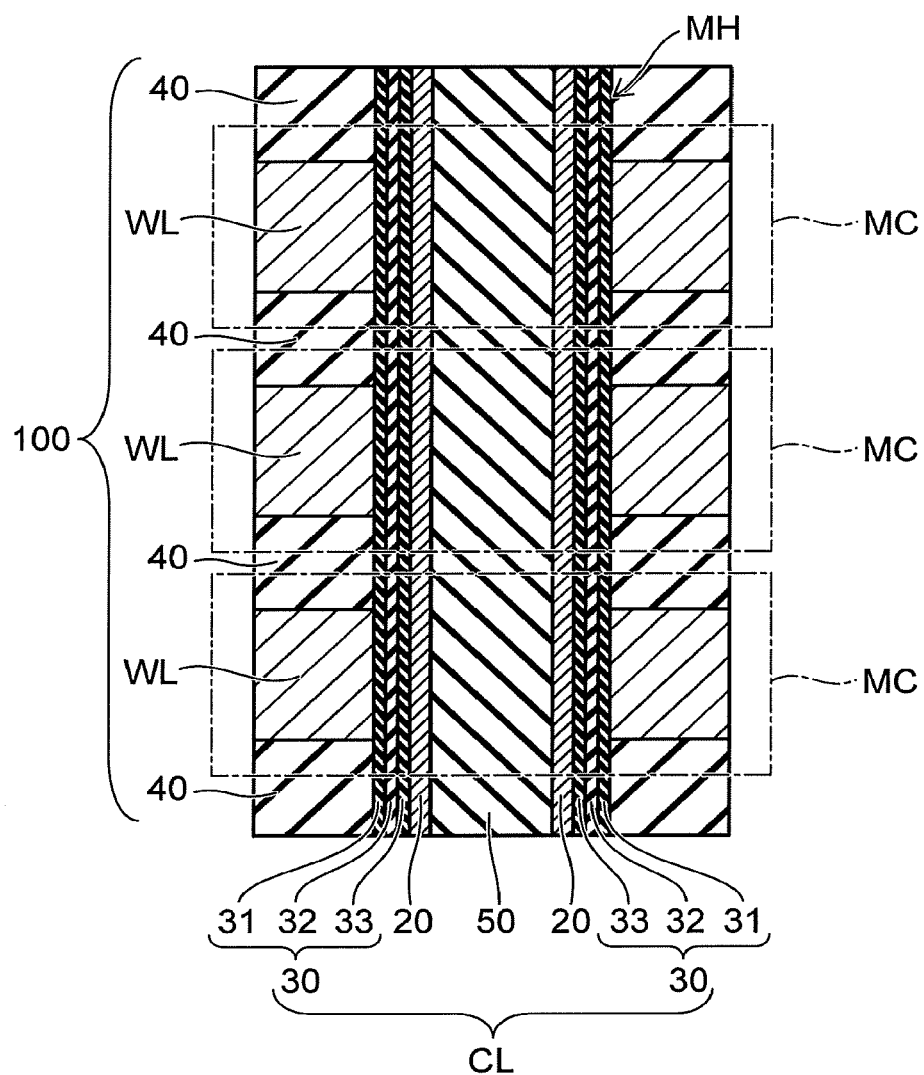
FIG. 4 is a schematic cross-sectional view showing the inside of dotted line frame shown in FIG. 3 in an enlarged manner.
Figure 5A:
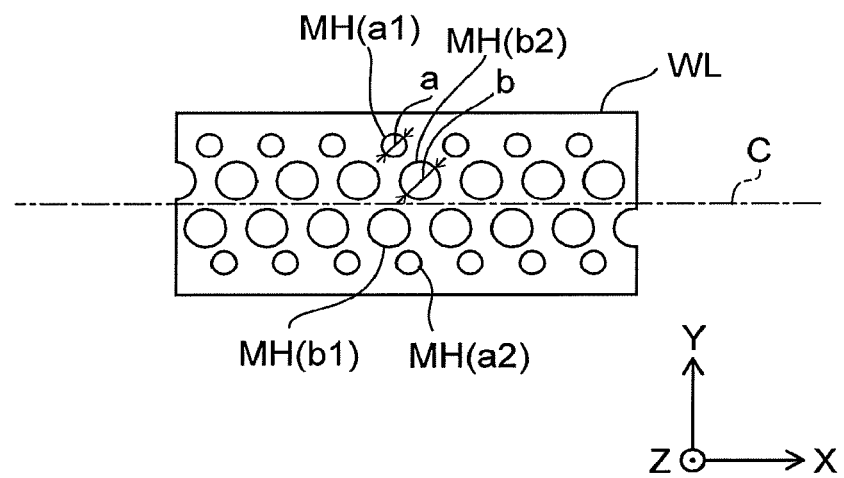
FIG. 5A and FIG. 5B are each a schematic view of each of the word lines WL of the semiconductor device of the first embodiment.
Figure 5B:
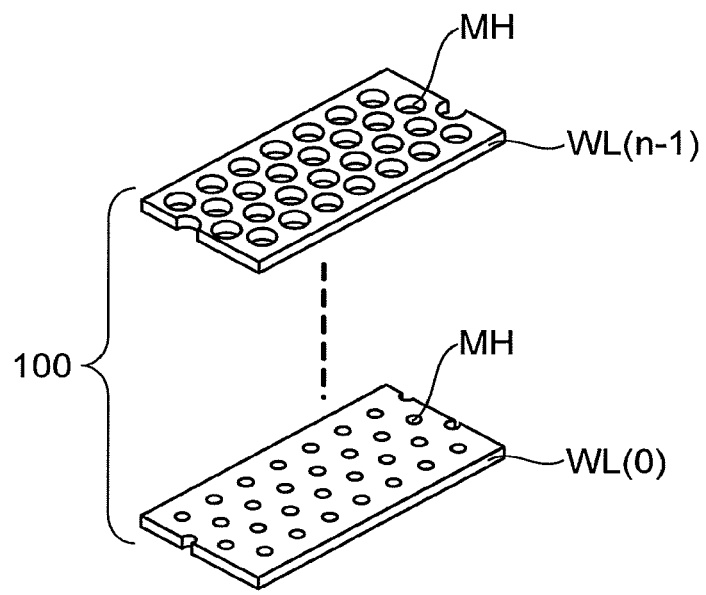

FIG. 3 is a schematic cross-sectional view of each of the columnar sections CL of the semiconductor device of the first embodiment. FIG. 4 is a schematic cross-sectional view showing the inside of dotted line frame 6 shown in FIG. 3 in an enlarged manner. FIG. 5A and FIG. 5B are each a schematic view of each of the word lines WL of the semiconductor device of the first embodiment.

FIG. 3 corresponds to a cross-section parallel to the Y-Z plane in FIG. 2.

As shown in FIG. 3 and FIG. 4, the columnar section CL is provided in the memory hole (opening) MH. The memory holes MH are provided to the stacked body 100 in the memory cell array 1. The memory holes MH extend along the stacking direction (the Z-direction) of the stacked body 100 in the stacked body 100. The columnar sections CL each include a memory film 30, a semiconductor body 20, and a core layer 50.

The memory film 30 is provided on the inner wall of the memory hole MH. The shape of the memory film 30 is, for example, a cylindrical shape. The memory film 30 includes a block insulating film 31, a charge storage film 32, and a tunnel insulating film 33.

The block insulating film 31 is provided on the inner wall of the memory hole MH. The block insulating film 31 includes, for example, silicon oxide.

The charge storage film 32 is provided on the block insulating film 31. The charge storage film 32 includes, for example, silicon nitride. The charge storage film 32 has trap sites for trapping the charge in the film, and thus traps the charge. A threshold voltage of the memory cell MC varies in accordance with presence or absence of the charge thus trapped, and an amount of charge thus trapped. Thus, the memory cell MC holds information.

The tunnel insulating film 33 is provided on the charge storage film 32. The tunnel insulating film 33 includes, for example, silicon oxide, or silicon oxide and silicon nitride. The tunnel insulating film 33 is a potential barrier between the charge storage film 32 and the semiconductor body 20. Through the tunnel insulating film 33, the charge tunnels when injecting the charge from the semiconductor body 20 to the charge storage film 32 (the program operation) and when discharging the charge from the charge storage film 32 to the semiconductor body 20 (the erasing operation).

In the stacked body 100, the electrode layers (SGD, WL, SGS) are provided on the memory film 30. The electrode layers (SGD, WL, SGS) each include, for example, tungsten.

The semiconductor body 20 is provided on the memory film 30 on the opposite side to the electrode layers (SGD, WL, SGS). The semiconductor body 20 includes, for example, silicon. The silicon is, for example, polysilicon obtained by crystallizing amorphous silicon. The conductivity type of the silicon is, for example, the P-type. The shape of the semiconductor body 20 is, for example, a bottomed cylindrical shape. The semiconductor layer 20 is electrically connected with, for example, the substrate 10.

On the semiconductor body 20, there is provided the core layer 50. The core layer 50 has an insulating property. The core layer 50 includes, for example, silicon oxide. The shape of the core layer 50 is, for example, a columnar shape. On the upper surface of the core layer 50, there is provided a cap layer 51. The cap layer 51 includes, for example, silicon. The silicon is, for example, polysilicon obtained by crystallizing amorphous silicon. The conductivity type of the silicon is, for example, the N-type. The cap layer 51 is electrically connected with the semiconductor body 20 in the upper part of the memory hole MH.

The memory hole MH is filled with the memory film 30, the semiconductor body 20, the core layer 50, and the cap layer 51.

On the upper surface of the stacked body 100, there are provided a first insulating film 81 and a second insulating film 82. The first insulating film 81 is provided on the stacked body 100. The second insulating film 82 is provided on the first insulating film 81. In the second insulating film 82, there is provided the contact part Cb. The contact part Cb is electrically connected with, for example, the semiconductor body 20 and the cap layer 51.

As shown in FIG. 5A, the plurality of memory holes MH is opened in the word lines WL. The arrangement pattern of the memory holes MH is, for example, a staggered arrangement lattice pattern. The diameter of the memory hole MH varies with the positions in the Y-direction. For example, the diameters of the memory holes MH (a1) and MH (a2) provided at positions distant from the center line C in the Y-direction of the word line WL are made smaller than the diameters of the memory holes MH (b1) and MH (b2) provided at positions close to the center line C.

Further, as shown in FIG. 5B, the diameter of the memory hole MH in the word line WL is different by the layer in which the word line WL is stacked. As the number of word lines WL stacked increases, the aspect ratio of the memory hole MH increases. Therefore, the lower the layer is, the smaller the diameter of the memory hole MH becomes. The diameter of the memory hole MH in the word line WL(0) in the lowermost layer is smaller than the diameter of the memory hole MH in the word line WL(n−1) in the uppermost layer.

As described above, the memory cell array 1 of the semiconductor device of the first embodiment includes the memory cells MC different in size by the position where the memory cell MC is disposed. For example, the area of the X-Y cross-section of the first columnar section of the first memory cell disposed in the memory hole MH(a1) and having the gate electrode connected with the first word line is smaller than the area of the X-Y cross-section of the second columnar section of the second memory cell disposed in the memory hole MH(b1) and having the gate electrode connected with the first word line. The size of the memory cell MC affects the shift amount of the threshold voltage of the memory cell.

In the case of data program, data reading, and so on, a voltage is applied between the word line WL and the channel formed in the semiconductor body 20. The voltage applied is applied to the block insulating film 31, the charge storage film 32, and the tunnel insulating film 33. If the diameter of the memory hole MH is small, the electric field applied to the block insulating film 31 becomes relatively weak, and the electric field applied to the tunnel insulating film 33 becomes relatively strong. The stronger the electric field applied to the tunnel insulating film 33 is, the larger the amount of the charge injected in the charge storage film 32, or the amount of the charge pulled out of the charge storage film 32 becomes.

For example, there is a case in which program weaker than normal program is performed on the memory cell MC, the data of which has been erased, after erasing the data to thereby shift the threshold voltage of the memory cell MC toward the positive side. This is a so-called "weak program operation." By performing the weak program operation in succession to the data erasing, it is possible to narrow the distribution width of the threshold voltage of the memory cell MC after the data erasing compared to the case of not performing the weak program operation. In the weak program operation, after pulling the charge (electrons) out of the charge storage film 32, or after injecting the charge (electrons) into the charge storage film 32, an electric field weaker than in the normal program operation is applied to, for example, the tunnel insulating film 33. The normal program operation is performed after the weak program operation is completed.

However, even in the weak program operation, the smaller the diameter of the memory hole MH is, the larger the amount of the charge injected becomes, and the larger the shift amount of the threshold voltage becomes.

Therefore, in the semiconductor device of the embodiment, in the case of performing the weak program after the data erasing, the value of the voltage applied between the gate electrode of the memory cell MC and the semiconductor body 20 forming the channel is set in accordance with the diameter of the memory hole MH.

Specifically, in the same word line WL, the voltage applied to the memory cell MC provided at a position distant from the center line C in the Y-direction of the word line WL is set to a value of a voltage lower than the voltage applied to the memory cell MC provided at a position closer to the center line C.

In the example shown in FIG. 5A, the voltage applied to the memory cells MC provided to the memory holes MH(a1) and MH(a2) is set to the value of the voltage lower than the voltage applied to the memory cells MC provided to the memory holes MH(b1) and MH(b2).

Further, in the example shown in FIG. 5B, the voltage applied to the memory cell MC using the lower layer, for example, the word line WL(0) as the gate electrode is set to a value of a voltage lower than the voltage applied to the memory cell MC using the upper layer, for example, the word line WL(n-1) as the gate electrode.

Figure 6:
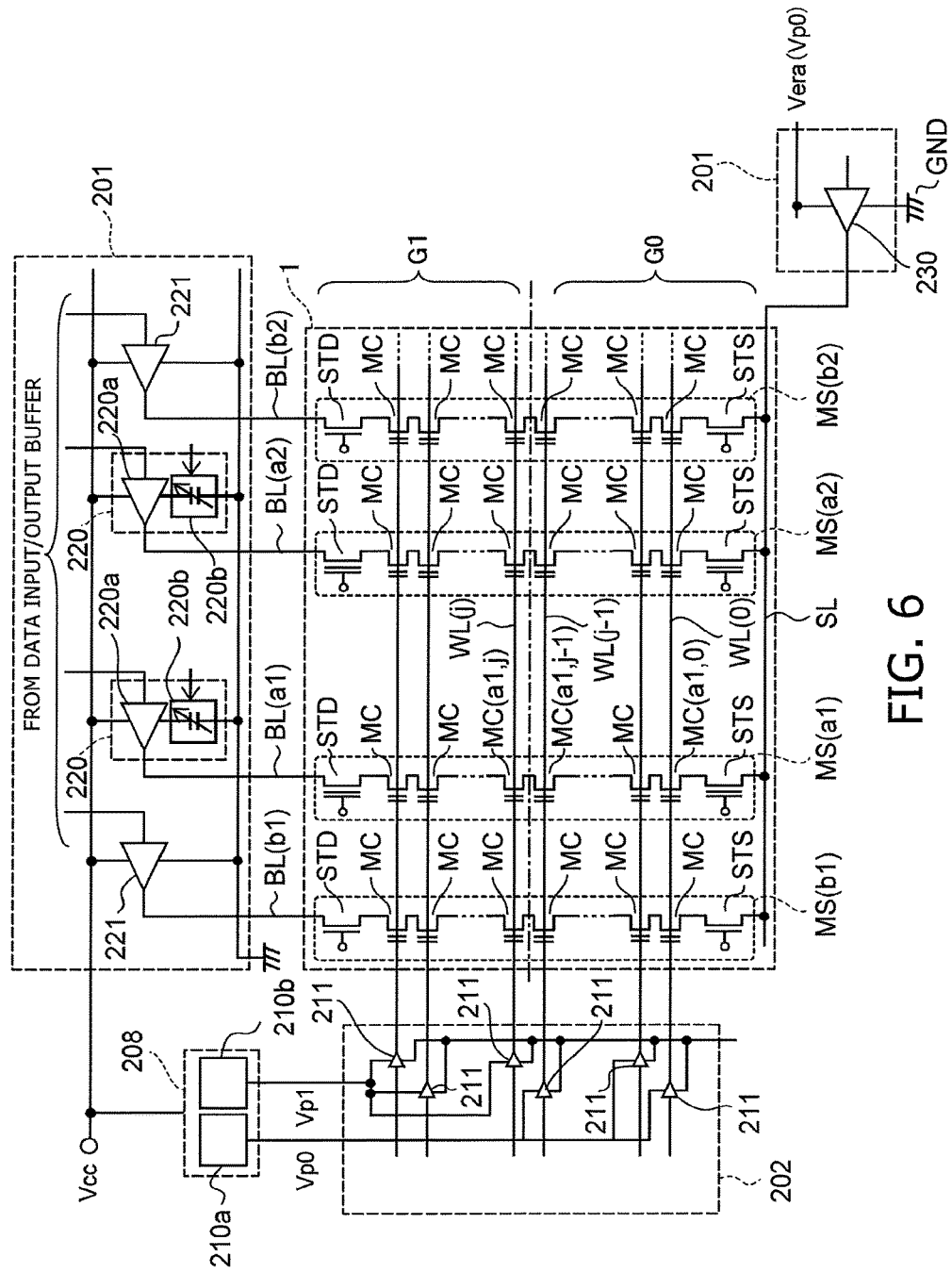
FIG. 6 is a block diagram illustrating a part of the semiconductor device of the first embodiment.

FIG. 6 is a block diagram illustrating a part of the semiconductor device of the first embodiment.

FIG. 6 shows an equivalent circuit of a part of the memory cell array 1, a part of the column control circuit 201, a part of the row control circuit 202, and a voltage generating circuit 208.

As shown in FIG. 6, the memory cell array 1 includes a plurality of memory strings MS(b1), MS(a1), MS(a2), MS(b2), . . . , Each of the memory strings MS(b1), MS(a1), MS(a2), MS(b2), . . . includes the memory cells MC connected in series to each other. Between the memory cell MC located in one end part of the memory cells MC connected in series to each other and the source line SL, there is connected the source-side selection transistor STS. Between the memory cell MC located in the other end part of the memory cells MC connected in series to each other and one of the bit lines BL(b1), BL(a1), BL(a2), BL(b2), . . . , there is connected the drain-side selection transistor STD.

The source-side selection transistor STS, the memory cells MC and the drain-side selection transistor STD are connected with each other with the semiconductor body 20, and are electrically connected in series to each other with the channel provided to the semiconductor body 20. The bit line BL is electrically connected with the channel provided to the semiconductor body 20.

In this example, there are provided m bit lines including the bit lines BL(b1), BL(a1), BL(a2), BL(b2), . . . . The bit lines BL(b1), BL(a1), BL(a2), BL(b2), . . . are connected with the respective outputs of the column control circuit 201.

In the memory cell array 1, one memory string MS(b1), for example, is connected with the same word line WL(j) to which another memory string MS(a1) is connected. In other words, the j+1-th word line WL(j) is shared by the memory strings MS different from each other. For example, there are provided n word lines WL(j). The symbol j denotes an integer of 0 to n-1.

The source line SL is provided to each of the blocks. Each of the memory strings MS is connected between the bit line BL and the common source line SL.

The word line WL(j) is connected with the output of the row control circuit 202. The row control circuit 202 applies a voltage to the word line WL(j).

The column control circuit 201 and the row control circuit 202 are disposed in a peripheral part of the memory cell array 1.

Hereinafter, the description will be presented assuming that the memory holes MH(a1) to MH(b2) are formed in the j+1-th word line WL(j) to have a staggered arrangement lattice pattern shown in FIG. 5A. The same applies to other word lines.

In the semiconductor device of the first embodiment, the memory cell array 1 includes the memory strings MS(a1), MS(a2), MS(b1), and MS(b2). The memory strings MS(a1), MS(a2) respectively correspond to the memory holes MH(a1), MH(a2) at the positions distant in the Y-direction from the center line C in the Y-direction of the word line WL. The memory strings MS(b1), MS(b2) respectively correspond to the memory holes MH(b1), MH(b2) at the positions closer to the center in the Y-direction of the word line WL.

The memory string MS(a1) is connected between the bit line BL(a1) and the source line SL. The memory string MS(a2) is connected between the bit line BL(a2) and the source line SL.

The memory string MS(b1) is connected between the bit line BL(b1) and the source line SL. The memory string MS(b2) is connected between the bit line BL(b2) and the source line SL.

The column control circuit 201 includes a source line driver 230. The output of the source line driver 230 is connected with the source line SL. The source line SL is provided to each of the blocks.

The source line driver 230 is supplied with an erasing voltage Vera from the voltage generating circuit 208. The source line driver 230 supplies the source line SL with the erasing voltage Vera in an erasing mode. In the erasing mode, the voltage of the word line WL is set to the low level, for example, the ground potential GND. Thus, the electrons stored in the charge storage film 32 are pulled out to the semiconductor body 20, or the holes are injected into the charge storage film 32 from the semiconductor body 20, to thereby erase the data.

The column control circuit 201 includes column drivers 220, 221. The outputs of the two column drivers 220 are connected respectively to the bit lines BL(a1), BL(a2). The outputs of the two column drivers 221 are connected respectively to the bit lines BL(b1), BL(b2). The inputs of the column drivers 220, 221 are connected with the data input/output buffer 203.

The column driver 220 includes a driver 220a and a compensation voltage generating circuit 220b. The driver 220a and the compensation voltage generating circuit 220b are connected in series to each other between, for example, the power supply voltage Vcc and the ground potential GND. The ground potential GND is, for example, the lowest potential in the inside of the semiconductor device. The ground potential GND is, for example, 0 V. The power supply voltage Vcc and the ground potential GND are supplied from an external power supply device or the like (not shown).

The compensation voltage generating circuit 220b outputs a compensation voltage Vcmp set in advance. The compensation voltage Vcmp is set in a range from the ground potential GND to the power supply voltage Vcc. For example, the compensation voltage Vcmp is set in a range of 0.5% to several % of a program voltage applied to the gate electrode of the memory cell MC.

The program voltage Vpgm applied to the word line WL selected in the normal program operation is, for example, 20 V. In contrast, the weak program voltage Vwpgm applied to the word line WL selected in the weak program operation is, for example, 10 V. The relationship between the weak program voltage Vwpgm and the program voltage Vpgm is, for example, as follows.

$$Vwpgm < Vpgm$$

By providing such a relationship, the following becomes possible.

In the weak program operation:
  to shift the threshold voltage of the memory cell MC within the threshold voltage range of the erasing state In the normal program operation:
  to shift the threshold voltage of the memory cell MC beyond the threshold voltage range of the erasing state The column drivers 220 drive the bit lines BL(a1), BL(a2) in accordance with the data input, respectively. The drive voltages of the bit lines BL(a1), BL(a2) are each the power supply voltage Vcc in high level, and the compensation voltage Vcmp in low level.

The compensation voltage Vcmp output by the compensation voltage generating circuit 220b can be arranged to arbitrarily be set by an external signal or the like. For example, the compensation voltage Vcmp can also be arranged to be set to an appropriate value in accordance with the size of the diameter of the memory hole MH. The compensation voltage Vcmp can also be set based on at least one of the program speed and the erasing speed of the memory cell.

Further, in the semiconductor device according to the first embodiment, it is also possible to set the compensation voltage Vcmp in accordance with the memory cell MC in a different layer in the same memory string MS. For example, it is possible to set the compensation voltage Vcmp in the case of programming the memory cell MC(a1,j) of the word line WL(j) to a voltage lower than the compensation voltage Vcmp in the case of programming the memory cell MC(a1, j−1) of the word line WL(j−1) in the next layer below. Similarly, it is possible to set the compensation voltage Vcmp in the case of programming the memory cell MC of the word line WL in a higher layer to a lower voltage. In other words, the compensation voltage Vcmp related to one bit line BL can be changed in value to be set by the word line WL to which the data is programmed.

It is sufficient for the column driver 221 to be the same as the driver 220a. The column drivers 221 respectively drive the bit lines BL(b1), BL(b2). The drive voltages of the bit lines BL(b1), BL(b2) are each the power supply voltage Vcc in high level, and the ground potential GND in low level.

In the data programming, the column drivers 220, 221 supply the low level to the bit lines BL in the case of setting the bit lines BL to a program-selected state (program-selected). In the case of setting the bit lines BL to a program-nonselected state (program-inhibited), the column drivers 220, 221 supply the high level to the bit lines BL.

It is assumed in the above description that regarding the memory holes MH(a1), MH(a2) small in diameter, the compensation voltage Vcmp is supplied by the column drivers 220, and regarding the memory holes MH(b1), MH(b2) large in diameter, the ground potential GND is supplied. In the semiconductor device of the embodiment, this is not a limitation. For example, it is also possible to arrange that the compensation voltages Vcmp corresponding to all of the memory holes MH are set, and the compensation voltage Vcmp is set in accordance with how easy the memory cell MC is programmed. Further, it is also possible to arrange that in the same memory string MS, the value of the compensation voltage Vcmp is set in accordance with the word line WL.

As described later, the memory cells MC are formed in a stacked manner together with the word lines WL. The word lines WL are connected with the memory cells MC different in memory string MS from each other in the same layer. The memory cell array 1 includes, for example, groups G0, G1. The group G0 is a group in the lower layer, and the group G1 is a group in the upper layer.

The row control circuit 202 includes row drivers 211 connected respectively to the word lines WL. The row drivers 211 are supplied with the power from the voltage generating circuit 208. The voltage generating circuit 208 includes a first pump circuit 210a and a second pump circuit 210b. The first pump circuit 210a and the second pump circuit 210b, for example, are supplied with the power from the power supply voltage Vcc, and output predetermined voltages.

The row driver 211 in the lower layer group G0 is supplied with a pump voltage Vp0 from the first pump circuit 210a. The row driver 211 in the upper layer group G1 is supplied with a pump voltage Vp1 from the second pump circuit 210b.

In the weak program of the data, the row driver 211 connected with the memory cells MC(a1, 0) to MC(a1, j−1) of the lower layer group G0 supplies the pump voltage Vp0 to the word lines WL(0) to WL(j−1) in the lower layer group G0 as the weak program voltage Vwpgm0.

The row driver 211 connected with the memory cells MC(a1, j) to MC(a1, n−1) of the upper layer group G1 supplies the pump voltage Vp1 to the word lines WL(j) to WL(n−1) in the upper layer group G1 as the weak program voltage Vwpgm1.

The weak program voltage Vwpgm0 applied to the word lines WL(0) to WL(j−1) in the lower layer group G0 is set to a value of a voltage lower than the weak program voltage Vwpgm1 applied to the word lines WL(j) to WL(n−1) in the upper layer group G1.

In the semiconductor device of the first embodiment, the compensation voltage Vcmp higher than the ground potential GND is applied to the memory strings MS(a1), MS(a2) distant from the center line C (see FIG. 5A) when selecting the bit line. The ground potential GND is applied to the memory strings MS(b1), MS(b2) close to the center line C when selecting the bit line.

In the case of performing the weak program on the memory cell MC, the weak program voltage Vwpgm0, Vwpgm1 is applied to the gate electrode of the memory cell MC. The channels of the memory strings MS(a1), MS(a2) are supplied with the compensation voltage Vcmp from the bit lines BL(a1), BL(a2), respectively. The channels of the memory strings MS(b1), MS(b2) are supplied with the ground potential GND from the bit lines BL(b1), BL(b2), respectively. Therefore, the voltage applied between the gate electrode of the memory cell MC and the semiconductor body 20 of each of the memory strings MS(a1), MS(a2) can be made lower as much as the compensation voltage Vcmp than the voltage applied between the gate electrode of the memory cell MC and the semiconductor body 20 of each of the memory strings MS(b1), MS(b2).

In the semiconductor device of the first embodiment, the weak program voltage Vwpgm0 to be applied to the gate electrode in the lower layer group G0 is set to a value lower than the weak program voltage Vwpgm1 to be applied to the gate electrode in the upper layer group G1. Therefore, the threshold voltage of the memory cell in the lower layer group G0 can be prevented from being significantly shifted toward the positive side to thereby be set to the roughly the same as the shift amount of the threshold voltage of the memory cell in the upper layer group G1.

Figure 7:
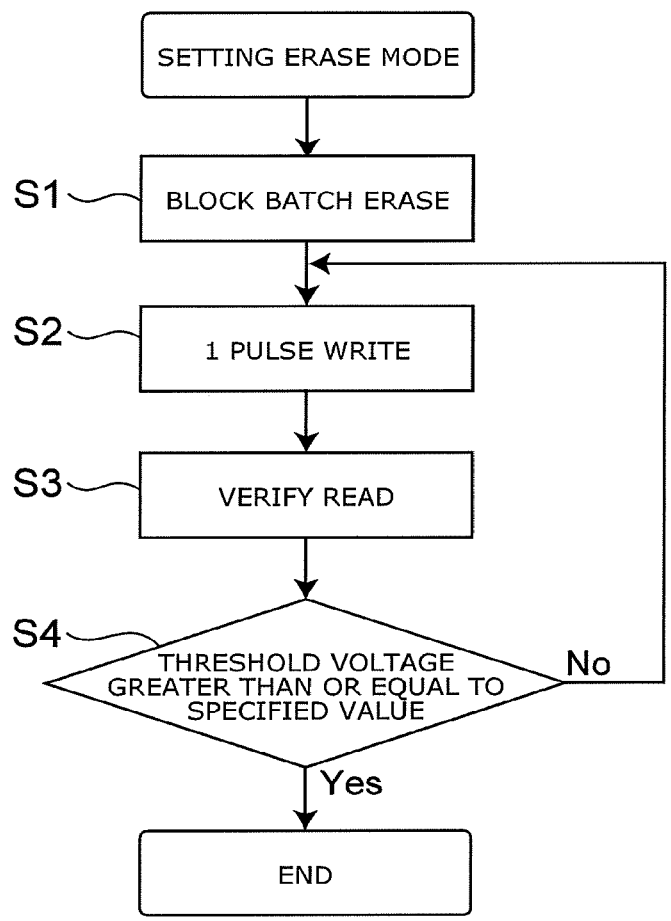
FIG. 7 is a flowchart for explaining the operation of the semiconductor device of the first embodiment.

FIG. 7 is a flowchart for explaining the operation of the semiconductor device of the first embodiment. FIG. 7 shows an operation in the erasing mode of the semiconductor device of the first embodiment.

In the erasing mode of the semiconductor device of the first embodiment, the weak program operation is performed. Specifically, charge extraction from the charge storage film 32 is performed, and then, the transition to the program operation is made to thereby suppress the variation in threshold voltage in the erasing operation.

As shown in FIG. 7, in the step S1, the command I/F 206 obtains an erasing command and the address (erasing block) in response to a command from the host 204, and then makes the semiconductor device make the transition to the data erasing mode. Due to the state machine 207, the voltage generating circuit 208 supplies the erasing voltage Vera to the source line driver 230. It should be noted that the state machine 207 makes a further transition of the state of the semiconductor device so that the steps S2 to S4 described below are executed. The state machine 207 is configured to perform the weak program operation after the erasing operation, further perform the normal program operation after the weak program operation. Due to the source line driver 230 corresponding to the address stored in an address register 205, the column control circuit 201 outputs the erasing voltage Vera to the source line SL. The row driver 211 outputs the low level. Thus, the potential of the semiconductor body 20 of each of the memory strings MS becomes higher than the potential of the word line WL. Therefore, the charge stored in the charge storage film 32 is extracted, and the threshold voltage of the memory cell MC is shifted toward the negative side to the threshold voltage of the erasing level, and thus, the data of the corresponding block is erased in a lump.

In the step S2, the column control circuit 201 and the row control circuit 202 start the weak program operation. In the weak program operation, firstly, preliminary program is performed with one pulse. It is sufficient for the program voltage in the weak program operation to be, for example, a voltage several volts lower than the program voltage Vpgm in the normal program operation. Therefore, the word line WL is supplied with the weak program voltage Vwpgm. It should be noted that it is also possible to adopt the same voltage as the program voltage Vpgm if needed.

The potential of the bit line BL set to the weak program-selected state is set to the compensation voltage Vcmp with respect to the bit lines BL(a1), BL(a2), and is set to the ground potential GND with respect to the bit lines BL(b1), BL(b2).

The weak program voltage Vwpgm0 is supplied to the memory cells MC in the lower layer group G0, and the weak program voltage Vwpgm1 is supplied to the memory cells MC in the upper layer group G1.

In the step S3, the column control circuit 201 and the row control circuit 202 perform verify read. In the step S3, the data in each of the memory cells MC is read out.

In the step S4, the column control circuit 201 and the row control circuit 202 determine whether or not the threshold voltage of each of the memory cells MC exceeds a specified value. Since the threshold voltage is shifted toward the positive direction due to the charge injected in the step S2, in the case in which the threshold voltage has reached the specified value, the weak program operation is terminated. In the case in which the threshold voltage has not reached the specified value, the process returns to the step S2 to repeat the weak program operation and the verify read operation.

The flowchart described above is illustrative only, and the invention is not limited to this example. For example, it is also possible to arrange that application of a single program pulse is executed without executing the steps S3, S4. In other words, the weak program operation can be performed on all of the memory cells MC corresponding to one page, or can also be performed on selected ones of the memory cells MC on which the weak program is to be performed.

In the former case, it is sufficient to set the potentials of the bit lines BL as follows, for example.

Weak program: Vcmp, or GND

In the latter case, it is sufficient to set the potentials of the bit lines BL as follows, for example, in accordance with whether the state is the "weak program-selected" state or the "weak program-inhibited" state.

Weak program-selected state: Vcmp, or GND

Weak program-inhibited state: Vcc

In the step S2, the voltage applied between the gate electrode and the channel of the memory cell MC is different as follows between the position of the word line WL to which the weak program voltage Vwpgm0 or Vwpgm1 is applied and, for example, the position of the bit line BL set to the weak program-selected state.

1. The case in which the word line WL, to which the weak program voltage Vwpgm0 is applied, belongs to the group G0

The potential of the bit line BL is set as follows.
(Weak program-selected state)
BL(a1): Vcmp
BL(a2): Vcmp
Therefore, the voltage V00 to be applied between the gate electrode and the channel of the selected memory cell MC becomes "Vwpgm0-(roughly Vcmp)."
BL(b1): GND
BL(b2): GND Therefore, the voltage V10 to be applied between the gate electrode and the channel of the selected memory cell MC becomes "Vwpgm0-(roughly GND)."

(Weak program-inhibited state)

BL(a1): Vcc
BL(a2): Vcc
BL(b1): Vcc
BL(b2): Vcc

Therefore, the voltages V00 and V10 to be applied between the gate electrode and the channel of the selected memory cell MC become "Vwpgm0-Vboost."

Assuming the voltage of the bit line BL as, for example, the power supply voltage Vcc, the drain-side selection transistor STD is cut off. Therefore, the channel of the memory cell MC becomes in the electrically floating state. The channel having been set to the electrically floating state couples with the word line WL to which a pass voltage Vpass and the weak program voltage Vwpgm are applied. Thus, the voltage of the channel rises to a boost voltage Vboost. The boost voltage Vboost is higher than, for example, the power supply voltage Vcc.

2. The case in which the word line WL, to which the weak program voltage Vwpgm1 is applied, belongs to the group G1

The potential of the bit line BL is set as described below.

(Weak program-selected state)

BL(a1): Vcmp
BL(a2): Vcmp

Therefore, the voltage V01 to be applied between the gate electrode and the channel of the selected memory cell MC becomes "Vwpgm1-(roughly Vcmp)."

BL(b1): GND
BL(b2): GND

Therefore, the voltage V11 to be applied between the gate electrode and the channel of the selected memory cell MC becomes "Vwpgm1-(roughly GND)."

(Weak program-inhibited state)

BL(a1): Vcc
BL(a2): Vcc
BL(b1): Vcc
BL(b2): Vcc

Therefore, the voltages V01 and V11 to be applied between the gate electrode and the channel of the selected memory cell MC become "Vwpgm1-Vboost."

According to the above, in the "weak program-selected" state, V00<V10, V01<V11 can be achieved. By setting the weak program voltage Vwpgm0, Vwpgm1 to appropriate values, it is also possible to achieve V10=V01, or to achieve V10<V01. The relationship between these voltages can appropriately be set in accordance with the structure, the size, and so on of the memory cell array 1.

As described above, in the "weak program-selected" state, the voltages V00 to V11 applied between the gate electrodes and the channels of the memory cells MC are appropriately set. Thus, it is possible to reduce the variation in shift amount of the threshold voltage due to the difference in size of the memory holes MH in one word line WL. Therefore, according to the embodiment, it becomes possible to homogenize the shift amounts of the threshold voltage of the respective memory cells MC in roughly the same level even if the difference in size of the memory hole MH has occurred in one word line WL.

It should be noted that for the weak program operation, it is also possible to use "step-up program." In the weak program operation using the "step-up program," every time the number of times of the weak program increases, the weak program voltages Vwpgm0 and Vwpgm1 are raised.

For example, it is assumed that the weak program voltages Vwpgm0 and Vwpgm1 are applied to perform the weak program operation, and perform the verify read. In the case in which the threshold voltage has not been reached as a result, the process returns to the step S2, and the weak program operation is executed once again. In the weak program operation (step S2) having been executed once again, the weak program voltages are set to "Vwpgm0+ΔV" and "Vwpgm1+ΔV." As described above, it is also possible to arrange that every time the weak program operation is repeated, the voltage "ΔV," for example, is added. If the "step-up program" is used for the weak program operation, it is possible to, for example, reduce the number of times of repeating the weak program operation and the verify read operation, and thus, the time necessary for the erasing mode can be shortened.

In the case of setting the compensation voltage Vcmp for each of the word lines WL in the memory string MS, the following operations will be performed. In the following example, the weak program operation will also be described.

For example, it is assumed that the word line WL(j−1) is selected to perform the weak program. The column drivers 220, 221 set the potentials of the bit lines BL as follows.

Weak program-selected state: Vcmp, or GND

The column drivers 220 output the compensation voltage Vcmp to the bit lines BL(a1) and BL(a2). In this case, the drivers 220a and the compensation voltage generating circuits 220b output the predetermined compensation voltage Vcmp to the bit lines BL(a1) and BL(a2) for the memory cell MC(a1,j−1), for example.

After the weak program to the memory cell MC connected with the word line WL(j−1) has been completed, the subsequent word line WL(j) is selected to perform the weak program. In the "weak program-selected" state, the drivers 220a and the compensation voltage generating circuits 220b output the predetermined compensation voltage Vcmp to the bit lines BL(a1) and BL(a2) for the memory cell MC(a1,j), for example. The value of the compensation voltage Vcmp is different between, for example, when the word line WL(j−1) has been selected and when the word line WL(j) has been elected.

By adopting such a configuration, it is possible for the column drivers 220 to supply the bit lines BL with the predetermined compensation voltage Vcmp for each of the word lines WL.

The functions and the advantages of the semiconductor device of the first embodiment will be described.

In the case of erasing the data, the data of the memory cells MC in the block is erased in a lump. The presence or absence of the data of each of the memory cells MC before erasing takes a variety of states, the threshold voltage distribution after erasing tends to spread widely, and the memory cell MC getting to a so-called over-erased state can also occur.

On the other hand, in order to increase the storage capacity of the semiconductor device, the multi-level storage is used in some cases. In the multi-level storage, it is necessary to finely perform the threshold voltage control in performing the program. If the threshold voltage distribution after erasing spreads widely, even if the fine threshold voltage control is performed in performing the program, it becomes difficult to make the threshold voltage converge with the desired value, and the improvement in operation stability cannot be expected.

Further, the memory cell MC in the over-erased state tends to increase in the shift amount of the threshold voltage when performing verify program, and sophisticated control of the threshold voltage becomes difficult. Taking the above into consideration, in the semiconductor device, in the erasing mode, there is performed the threshold voltage control of performing the weak program after the batch erasure to thereby shift the threshold voltages distributed in a lower area toward the positive side.

Figure 8A:
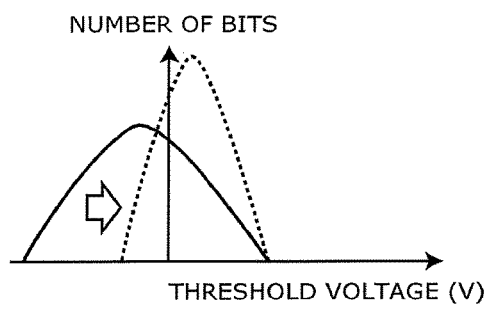
FIG. 8A and FIG. 8B are schematic views each showing a distribution of the threshold voltage after erasing.
Figure 8B:
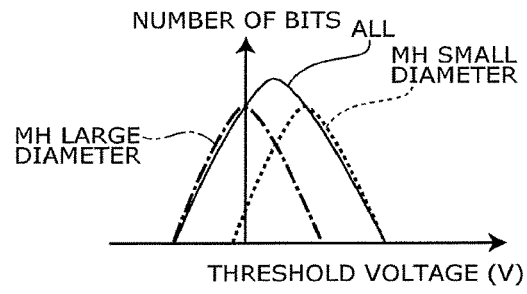

FIG. 8A and FIG. 8B are schematic views each showing a distribution of the threshold voltage after erasing.

As shown in FIG. 8B, after the block batch erasure, the threshold voltage shows a large distribution. By performing the weak program thereon, it is possible to provide the threshold voltage distribution with a narrower range as indicated by the dotted line in FIG. 8A.

For example, the intensity of the electric field to be applied to the tunnel insulating film 33 is different by the difference in diameter of the memory hole MH. Therefore, as shown in FIG. 8B, the smaller the diameter of the memory hole MH is, the higher the electric field becomes, and the larger the injection amount of the charge becomes. Therefore, there is a tendency that the shift amount in the positive direction of the threshold voltage increases (dotted line). In the memory cell MC large in diameter of the memory hole MH, there is a tendency that the shift amount of the threshold voltage decreases (dashed-dotted line). In this regard, according to the embodiment, for example, it is possible to narrow the width of the threshold voltage distribution after erasing due to the difference in diameter of the memory hole MH.

Further, according to the embodiment, the voltage to be supplied to the bit lines BL when performing the weak program is controlled in accordance with the diameter of the memory hole MH, for example. Thus, it becomes possible to make the variation in the threshold voltage after performing the weak program smaller compared to the case of not controlling the voltage to be supplied to the bit lines BL when performing the weak program. Thus, it is possible to prevent, for example, an increase in the width of the threshold voltage distribution after erasing from occurring due to the difference in diameter of the memory hole MH.

In the semiconductor device of the first embodiment, the voltage to be applied between the gate electrode and the channel of the memory cell MC when performing the weak program is set in accordance with the diameter of the memory hole MH. In the case in which the diameter of the memory hole MH is small, the voltage when performing the weak program is set to be lower than in the case in which the memory hole MH is larger. Therefore, the variation in the amount of charge to be injected into the charge storage film 32 when performing the weak program is reduced, and thus the variation in the shift amount of the threshold voltage is suppressed. Therefore, after erasing, the threshold voltage distribution with narrower width can be realized.

Although in the embodiment described above, there is described the case in which the memory holes MH are provided with the two types of diameters in one word line WL, it is also possible to cope with the three or more types of diameters of the memory holes MH by respectively setting the compensation voltages Vcmp in accordance with the diameter of the memory hole MH. Further, it is also possible to arrange that the compensation voltage Vcmp is set in accordance the shift amount of the threshold voltage when performing the weak program irrespective of the size of the diameter of the memory hole MH, or in addition to the size of the diameter of the memory hole MH. Further, it is also possible to arrange that the compensation voltage Vcmp is set in accordance with the film thickness of the block insulating film 31 or the tunnel insulating film 33.

Although in the above description, it is assumed that the shape of the memory hole MH is a roughly circular shape, the shape is not limited to the circular shape, and can obviously be a polygonal shape such as a rectangular shape. In the semiconductor device of the embodiment, the variation in the shift amount of the threshold voltage when performing the weak program can be suppressed in accordance with the diameter, the area or the boundary length of the memory hole MH.

Second Embodiment

In the first embodiment, there is illustrated the case of the three-dimensional semiconductor memory device. In the second embodiment, there will be illustrated the case of a two-dimensional semiconductor memory device. The system configuration of the second embodiment is substantially the same as in the first embodiment shown in FIG. 1, for example.

Figure 9A:
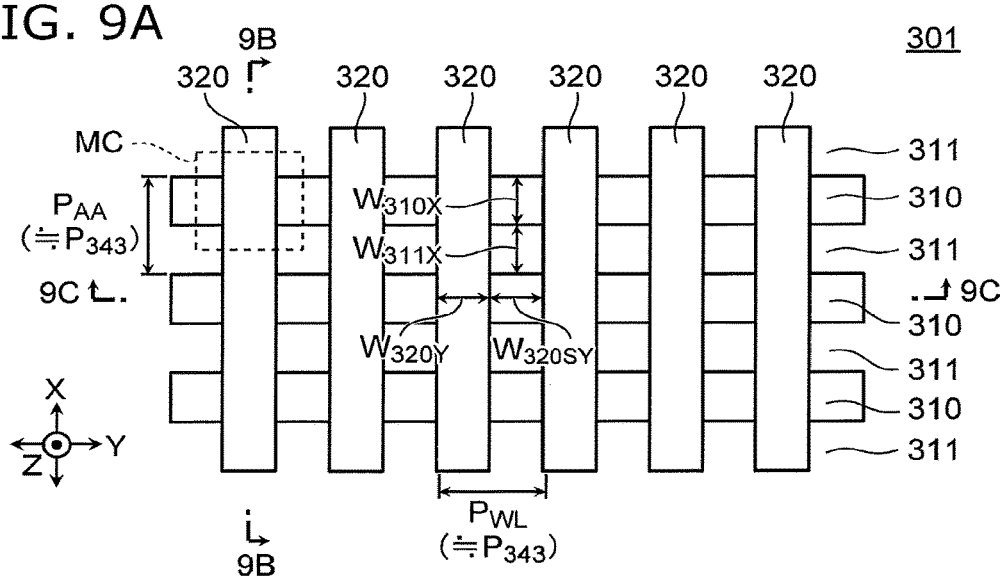
FIG. 9A is a schematic plan view showing a memory cell array of the semiconductor device of the second embodiment.
Figure 9B:
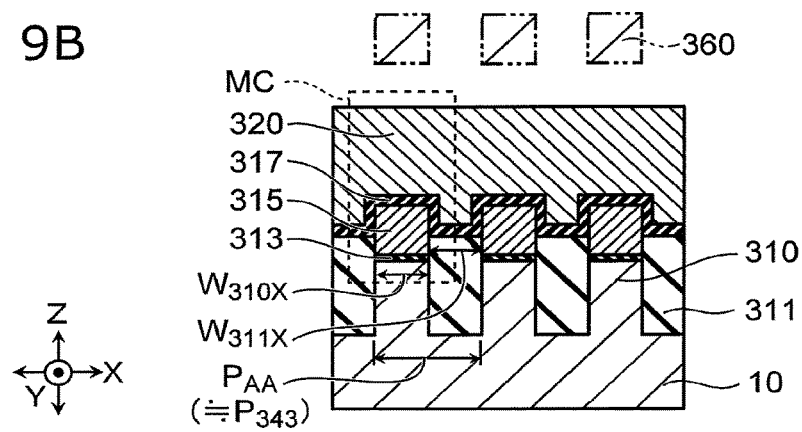
FIG. 9B is a schematic cross-sectional view along the line 9B-9B in FIG. 9A.
Figure 9C:
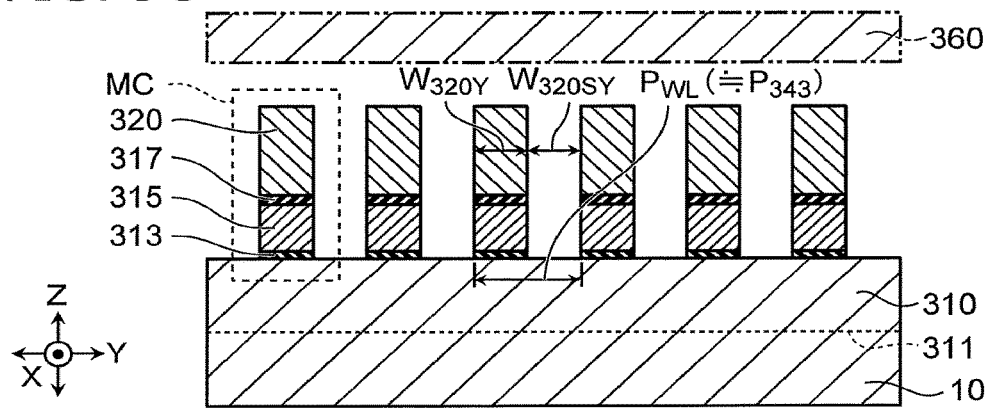
FIG. 9C is a schematic cross-sectional view along the line 9C-9C in FIG. 9A.

FIG. 9A is a schematic plan view showing a memory cell array of the semiconductor device of the second embodiment, FIG. 9B is a schematic cross-sectional view along the line 9B-9B in FIG. 9A, and FIG. 9C is a schematic cross-sectional view along the line 9C-9C in FIG. 9A.

As shown in FIGS. 9A to 9C, the memory cell array 301 is a "two-dimensional type" spreading like a plane. The memory cell array 301 of the two-dimensional type includes semiconductor layers 310 each extending in the Y-direction, and word lines 320 each extending in the X-direction. The semiconductor layers 310 are provided in a surface part of the substrate 10. The semiconductor layers 310 are separated from each other by separation regions 311 in a striped manner. The semiconductor layers 310 are each an area called, for example, an "active area." The channels of the memory strings MS can be obtained in the semiconductor layers 310. The separation regions 311 are provided in the surface part of the substrate 10. The separation regions 311 each have an insulating property. The memory cells MC are disposed at respective interconnections between the semiconductor layers 310 and the word lines 320.

The memory cells MC are provided on the semiconductor layers 310. On the semiconductor layers 310, the memory cells MC each include a tunnel insulating film 313, a charge storage layer 315, and IPD (Inter-Poly Dielectric) film 317, and the word line 320. The tunnel insulating film 313 is provided on the semiconductor layer 310. The charge storage layer 315 is provided on the tunnel insulating film 313. The IPD film 317 is provided on the charge storage layer 315. The word line 320 is provided on the IPD film 317.

Bit lines 360 are provided above the word lines 320 (the bit lines 360 are omitted in FIG. 9A). The bit lines 360 each extend along the semiconductor layer 310 in the Y-direction, for example. Although not shown in the drawings, the bit lines 360 are electrically connected with the semiconductor layers 310 as well known to the public. The bit lines 360 are electrically connected with drain-side selection transistors STD not shown in the drawings. Although not shown in the drawings similarly to the bit lines 360, the source line SL is provided on the semiconductor layers 310. The source line SL is electrically connected with source-side selection transistors STS not shown in the drawings. The memory cells MC are connected in series to each other between the source-side selection transistor STS and the drain-side selection transistor STD.

When advancing the miniaturization of the two-dimensional memory cell array 301 shown in FIGS. 9A to 9C, a method called, for example, a "double sidewall forming method" is used in some cases. By using the "double sidewall forming method," it is possible to form, for example, a line and space pattern (L/S pattern) with a resolution finer than the resolution limit of photolithography. For example, in the memory cell array 301, when forming the pattern of the semiconductor layers 310 or the pattern of the word lines 320, the "double sidewall forming method" is used in some cases. FIG. 10A to FIG. 10E show a basic process of the "double sidewall forming method".

FIG. 10A to FIG. 10E are schematic cross-sectional views showing the basic process of the "double sidewall forming method."

1. Formation of the L/S Pattern with First Core Members 331

Figure 10A:
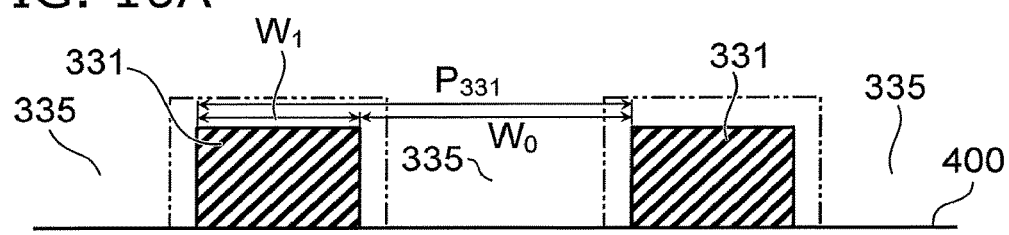
FIG. 10A to FIG. 10E are schematic cross-sectional views showing the basic process of the "double sidewall forming method"

As shown in FIG. 10A, the L/S pattern with the first core members 331 is formed on a foundation layer 400. The L/S pattern with the first core members 331 is formed using, for example, a photolithography method. The pitch $P_{331}$ of the L/S pattern with the first core members 331 is set to, for example, roughly the resolution limit RL of the photolithography method ($P_{331} \approx RL$). In the case in which the surface of the foundation layer 400 is made of, for example, silicon, a silicon oxide film, for example, is selected as the material of the first core members 331.

Then, the first core members 331 are slimmed. Thus, the width $W_0$ of the space 335 between the first core members 331 is set wider than the width (line) $W_1$ of each of the first core members 331 ($W_0 > W_1$).

2. Formation of the L/S pattern with Second Core Members 333

Figure 10B:
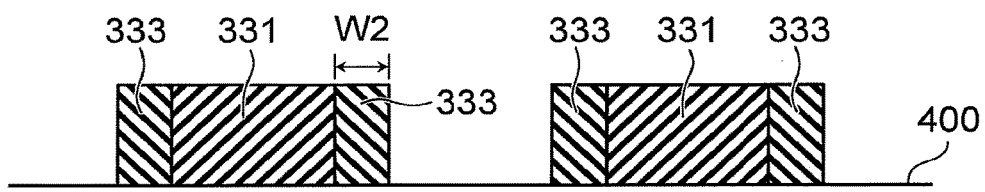

As shown in FIG. 10B, second core members 333 each having a sidewall shape are formed on the sidewalls of the first core members 331. As the material of the second core members 333, there is selected a material different from the material of the first core members 331 such as a silicon nitride film. The second core members 333 are formed by forming, for example, the silicon nitride film on the surface of the foundation layer 400 and the surfaces of the first core members 331, and then anisotropically etching the silicon nitride film thus formed. The width $W_2$ of the second core member 333 is controlled by, for example, the film thickness of the silicon nitride film.

Figure 10C:
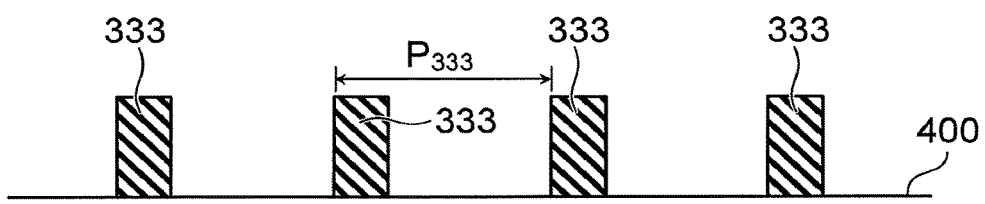

Then, as shown in FIG. 10C, the first core members 331 are selectively removed to leave the second core members 333 on the foundation layer 400. The pitch $P_{333}$ of the L/S pattern with the second core members 333 becomes, for example, roughly half as large as the pitch $P_{331}$ of the L/S pattern with the first core members 331 ($P_{333} \approx (P_{331})/2$).

3. Formation of the L/S Pattern with Mask Members 343

Figure 10D:
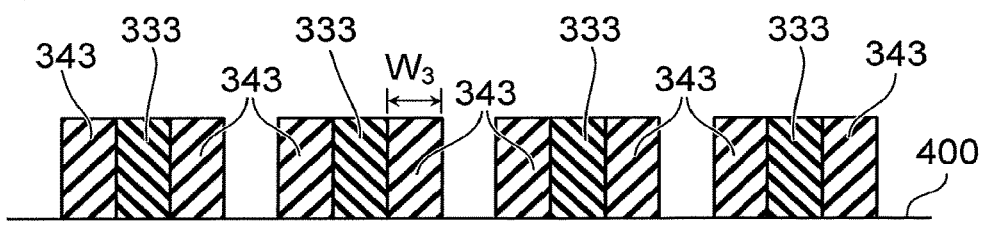

As shown in FIG. 10D, mask members 343 each having a sidewall shape are formed on the sidewalls of the second core members 333. As the material of the mask members 343, there is selected a material different from the material of the second core member 333 such as a silicon oxide film. The mask members 343 are formed by forming, for example, the silicon oxide film on the surface of the foundation layer 400 and the surfaces of the second core members 333, and then anisotropically etching the silicon oxide film thus formed. The width $W_3$ of the mask member 343 is controlled by, for example, the film thickness of the silicon oxide film.

Figure 10E:
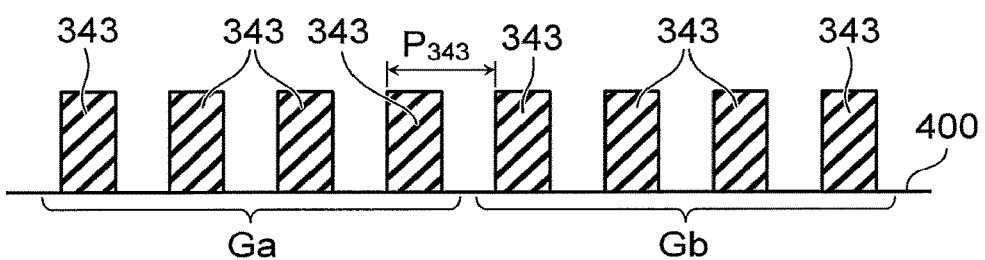

Then, as shown in FIG. 10E, the second core members 333 are selectively removed to leave third mask members 343 on the foundation layer 400. The pitch $P_{343}$ of the L/S pattern with the mask members 343 becomes, for example, roughly quarter as large as the pitch $P_{331}$ of the L/S pattern with the first core members 331 ($P_{343} \approx (P_{331})/4$).

If the pattern of the semiconductor layers 310 is formed using the L/S pattern with the mask member 343 as the etching mask, it is possible to set the pattern pitch $P_{AA}$ in the X-direction of the semiconductor layers 310 to be roughly equal to "$P_{343}$" which is finer than the resolution limit RL ($P_{AA} \approx P_{343}$). Similarly, if the pattern of the word lines 320 is formed, the pattern pitch $P_{WL}$ in the Y-direction of the word lines 320 can be set to be roughly equal to "$P_{343}$" ($P_{WL} \approx P_{343}$).

In the "double sidewall forming method," the four mask members 343 are obtained from one of the first core members 331 to be the reference of the LIS pattern (see the groups Ga and Gb in FIG. 10E). Therefore, for example, if the width $W_1$ of one first core member 331 varies, the variation affects the pitch $P_{343}$ and the width $W_3$ of the four mask members 343. For example, in the memory cell array 301, at least one of the dimensions (1) to (6) described below periodically varies with four semiconductor layers 310 forming "one group," and/or four word lines 320 forming "one group."

(1) The pattern pitch $P_{AA}$ in the X-direction of the semiconductor layers 310

(2) The width $W_{310X}$ in the X-direction of the semiconductor layers 310

(3) The width $W_{311X}$ in the X-direction of the separation regions 311

(4) The pattern pitch $P_{WL}$ in the Y-direction of the word lines 320

(5) The width $W_{320Y}$ in the Y-direction of the word lines 320

(6) The width $W_{320SY}$ in the Y-direction between the word lines 320

FIG. 11A to FIG. 11E are schematic cross-sectional views showing an example of the variation in the mask members 343. The cross-sections shown in FIG. 11A to FIG. 11E correspond respectively to the cross-sections shown in FIG. 10A to FIG. 10E.

Figure 11A:
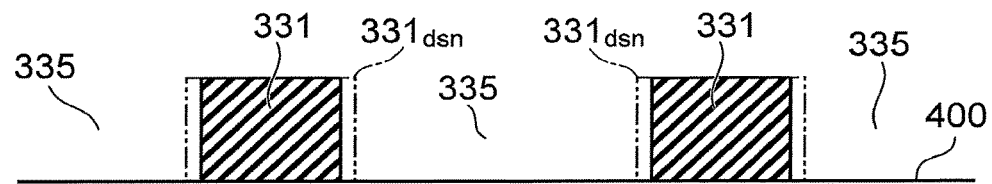
FIG. 11A to FIG. 11E are schematic cross-sectional views showing an example of the variation in the mask members.
Figure 11B:
Figure 11C:
Figure 11D:
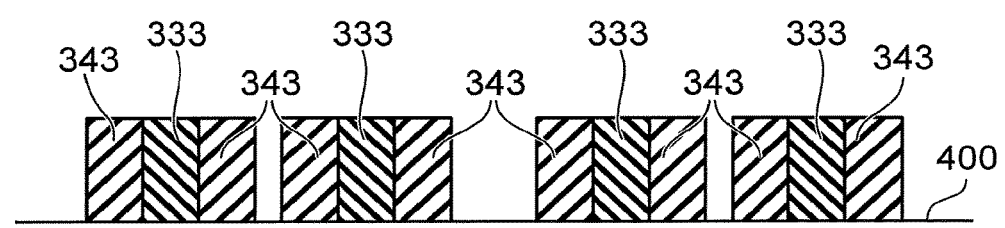

As shown in FIG. 11A, it is assumed that the sliming amount is shifted from the design value (denoted by the reference symbol 331dsn in the drawing) in the "slimming" process of the first core members 331. FIG. 11A shows an example in which the slimming amount has increased. The "shift" of the slimming amount of the first core members 331 from the design value causes parts 351 narrower in interval and parts 355 wider in interval in the final pattern of the mask members 343 as shown in FIG. 11B to FIG. 11E. How the parts 351 narrow in interval appear and how the parts 355 wide in interval appear are, for example, the same between the group Ga and the group Gb. If the word lines 320 are formed using such mask members 343, there occurs, for example, the following phenomenon.

Figure 11E:
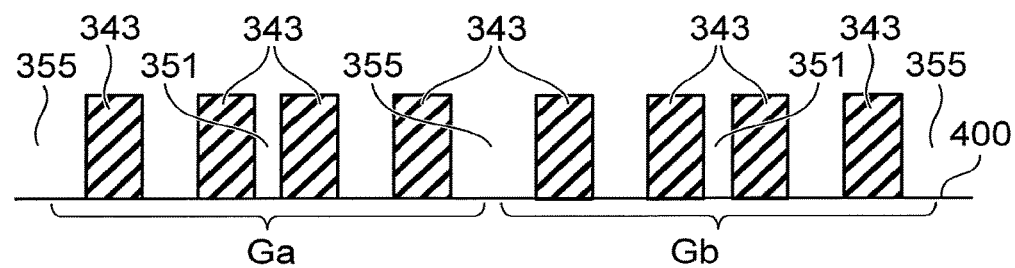
Figure 12:
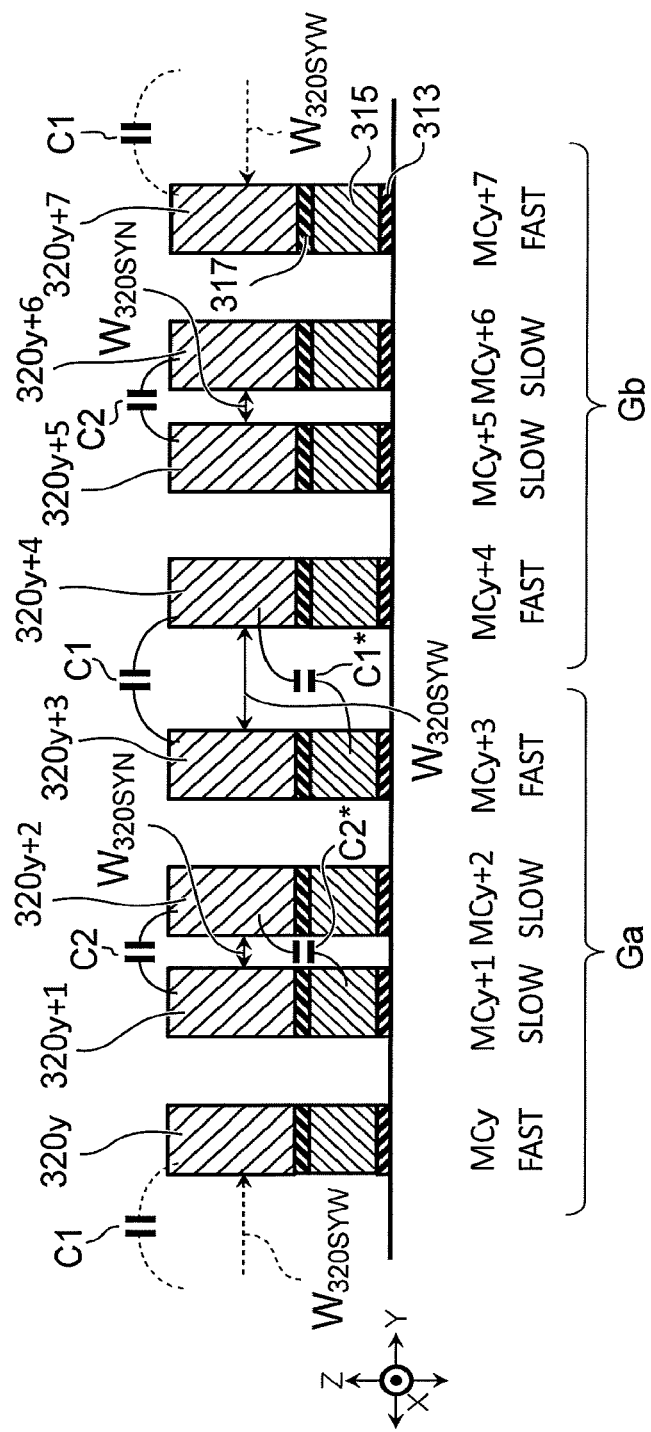
FIG. 12 is a schematic cross-sectional view of the word lines along the Y-direction.

FIG. 12 is a schematic cross-sectional view of the word lines along the Y-direction. FIG. 12 shows the word lines 320 (320y to 320y+7) formed using the mask members 343 having the pattern shown in FIG. 11E. The cross-section shown in FIG. 12 corresponds to the cross-section shown in FIG. 9C.

As shown in FIG. 12, it is assumed that, for example, the word lines 320y to 320y+3 are formed using the mask members 343 in the group Ga shown in FIG. 11E, and the word lines 320y+4 to 320y+7 are formed using the mask members 343 in the group Gb. In this case, the width $W_{320SY}$ in the Y-direction between the word lines 320 varies.

For example, the width $W_{320SYN}$ between the word lines 320y+1 and 320y+2, and between the word lines 320y+5 and 320y+6 becomes narrower, and the width $W_{320SYW}$ between the word lines 320y+3 and 320y+4 becomes wider. Therefore, the capacitance C2 between the word lines 320y+1 and 320y+2, and between the word lines 320y+5 and 320y+6 becomes higher than the capacitance C1 between the word lines 320y+3 and 320y+4. The capacitances C1, C2 relate to the CR time constant of the word lines 320, and therefore particularly affect the program speed. If the miniaturization of the two-dimensional memory cell array 301 further advances, the influences of the capacitances between the word line 320 of the memory cell and the charge storage layer 315 of the adjacent memory cell, for example, the capacitances C1*, C2* and so on shown in FIG. 12 increase. Therefore, the difference in the width $W_{320SY}$ in the Y-direction between the word lines 320 has been affecting not only the program speed but also the weak program speed after erasing.

Therefore, the program speed, or both of the program speed and the erasing speed of the memory cells MCy, MCy+3, MCy+4, and MCy+7 increase (see "FAST" in FIG. 12), and the program speed, or both of the program speed and the erasing speed of the memory cells MCy+1, MCy+2, MCy+5 and MCy+6 decrease (see "SLOW" in FIG. 12). The differences in the program speeds, or both of the program speeds and the erasing speeds described below, for example, periodically occur along the Y-direction in the memory cells MCy to MCy+7.

Group Ga
MCy: FAST
MCy+1: SLOW
MCy+2: SLOW
MCy+3: FAST
Group Gb
MCy+4: FAST
MCy+5: SLOW
MCy+6: SLOW
MCy+7: FAST Defining the number of the word lines 320 as "X," the number of times of the periodic repeat described above is "X/4" times. For example, assuming the number of the word lines 320 as "32," the number of times of the periodic repeat is "8" times.

The periodic difference in the program speed occurs not only in the Y-direction, but also in the X-direction. For example, if the width $W_3$ of the mask member 343 varies, the difference in the program speed and the difference in the erasing speed periodically occur along the X-direction in some cases.

Figure 13:
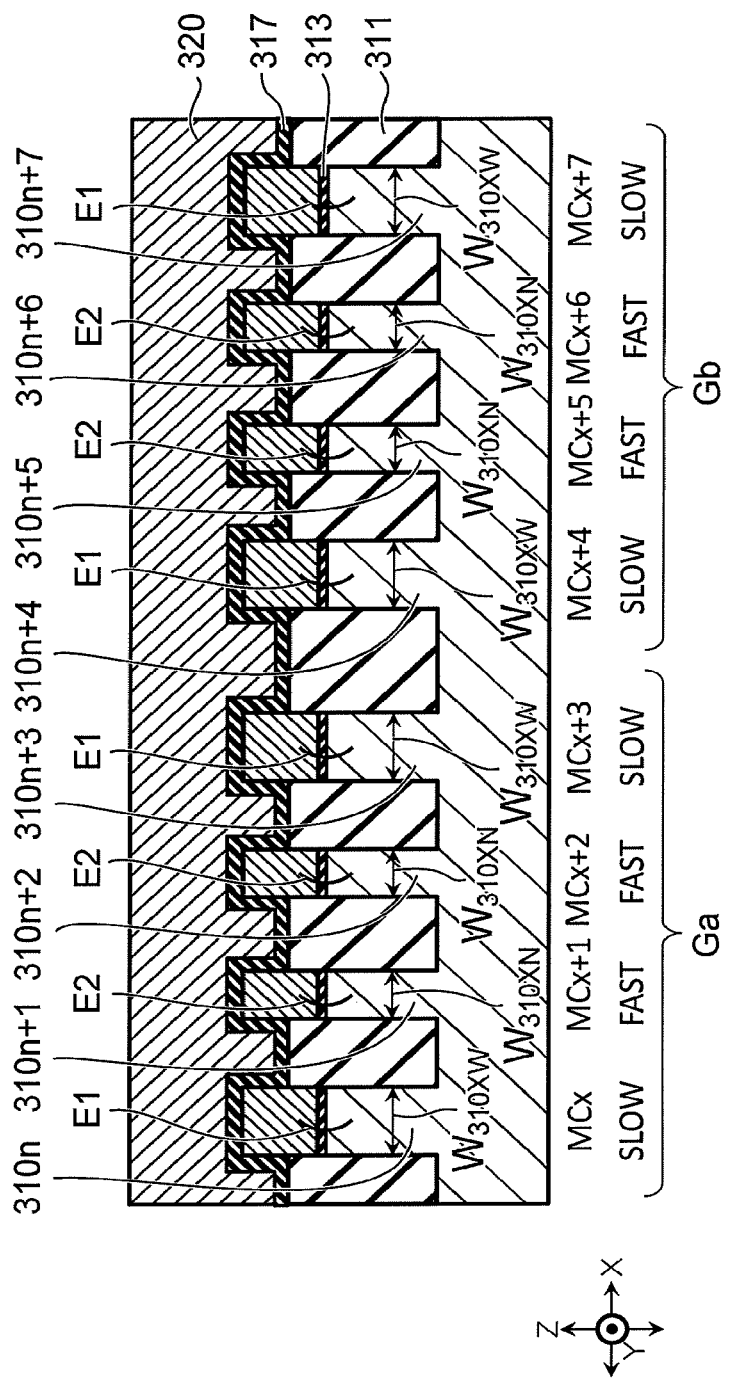
FIG. 13 is a schematic cross-sectional view of the word line along the X-direction.

FIG. 13 is a schematic cross-sectional view of the word line 320 along the X-direction. The cross-section shown in FIG. 13 corresponds to the cross-section shown in FIG. 9B.

As shown in FIG. 13, if the semiconductor layers 310 are formed using the mask member 343 varying in the width $W_3$ as the etching mask, the width $W_{310X}$ of the semiconductor layers 310 varies.

For example, the width $W_{310XW}$ of the semiconductor layers 310n, 310n+3, 310n+4 and 310n+7 becomes wider, and the width $W_{310XN}$ of the semiconductor layer 310n+1, 310n+2, 310n+5, and 310n+6 becomes narrower. Therefore, the electric field E1 applied to the tunnel insulating films 313 on the semiconductor layers 310n, 310n+3, 310n+4, and 310n+7 becomes weaker, and the electric field E2 applied to the tunnel insulating film 313 on the semiconductor layer 310n+1, 310n+2, 310n+5, and 310n+6 becomes stronger.

The intensity levels of the electric fields E1 and E2 affect the program speed and the erasing speed.

Therefore, the program/erasing speed of the memory cells MCx, MCx+3, MCx+4, and MCx+7 become slower (see "SLOW" in FIG. 13), and the program/erasing speed of the memory cells MCx+1, MCx+2, MCx+5, and MCx+6 becomes faster (see "FAST" in FIG. 13). The differences in program/erasing speeds described below periodically occur along the X-direction in the memory cells MCx to MCx+7.

Group Ga
MCx: SLOW
MCx+1: FAST
MCx+2: FAST
MCx+3: SLOW
Group Gb
MCx+4: SLOW
MCx+5: FAST
MCx+6: FAST
MCx+7: SLOW Defining the number of the semiconductor layers 310 as "Y," the number of times of the periodic repeat described above is "Y/4" times. For example, assuming the number of the semiconductor layers 310 as "2048," the number of times of the periodic repeat is "512" times.

With respect to the above circumstances, in the semiconductor device of the second embodiment, the controlled compensation voltage Vcmp is applied to the bit lines BL and the controlled weak program voltage Vwpgm is applied to the word lines 320 when performing the weak program. Thus, the following, for example, is suppressed.

Variation in the threshold voltage after performing the weak program due to the difference between the electric fields E1, E2

Variation in the threshold voltage after performing the weak program due to the difference between the capacitances C1, C2

Figure 14:
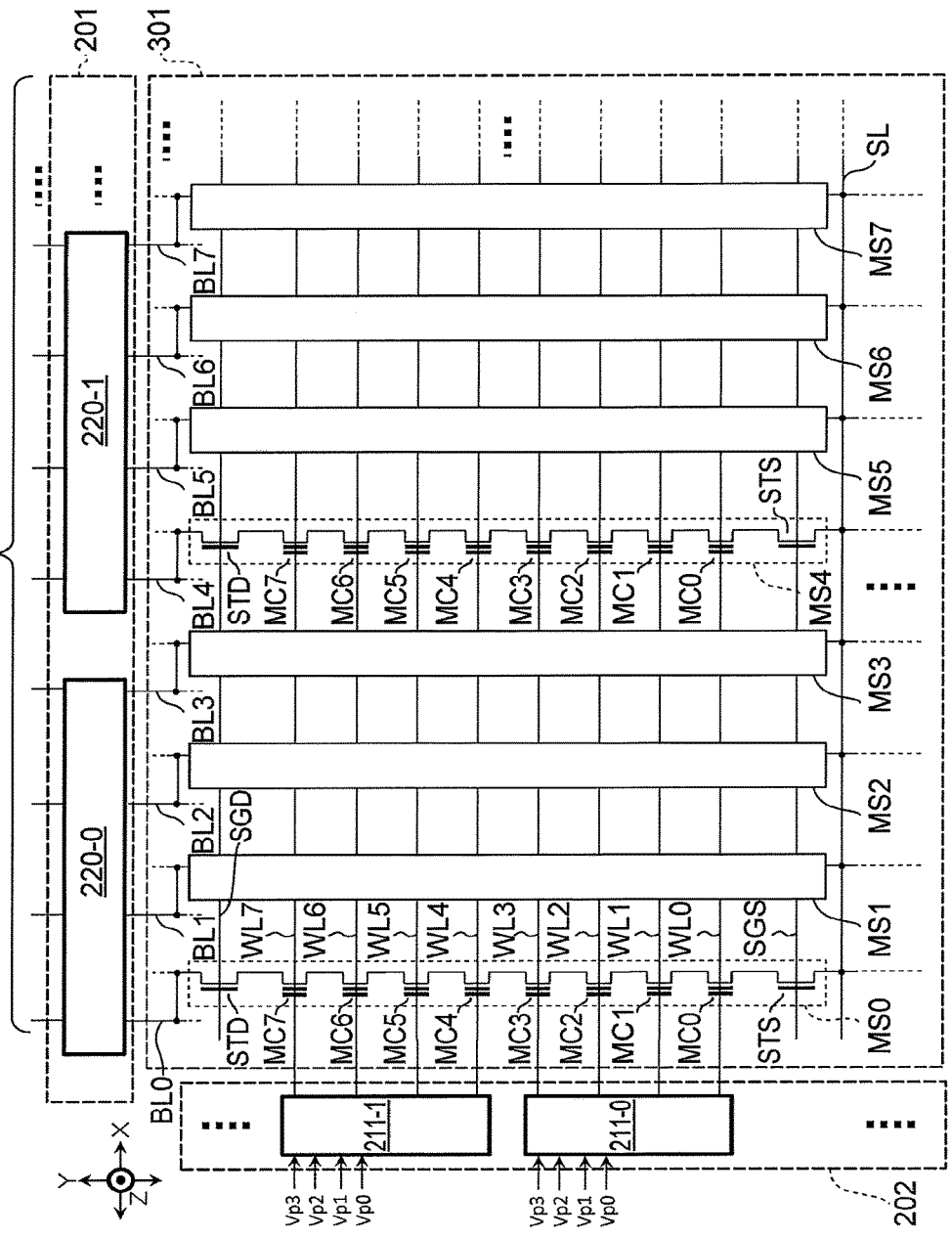
FIG. 14 is a block diagram illustrating a part of the semiconductor device of the second embodiment.

FIG. 14 is a block diagram illustrating a part of the semiconductor device of the second embodiment.

As shown in FIG. 14, the memory cell array 301 has memory strings MS0 to MS7, . . . . The memory strings MS0 to MS7, . . . include, for example, a plurality of memory cells MC0 to MC7, the drain-side selection transistor STD, and the source-side selection transistor STS. The plurality of memory cells MC, the drain-side selection transistor STD, and the source-side selection transistor STS are provided on the semiconductor layers 310 (see FIG. 9A to FIG. 9C). The plurality of memory cells MC is connected in series via the semiconductor layers 310.

The column control circuit 201 includes, for example, column drivers 220-0, 220-1, . . . . The output of the column driver 220-0 is connected with the channels of the memory strings MS0 to MS3 via the four bit lines BL0 to BL3. The output of the column driver 220-1 is connected with the channels of the memory strings MS4 to MS7 via the four bit lines BL4 to BL7.

The row control circuit 202 includes row drivers 211-0, 211-1, . . . . The output of the row driver 211-0 is connected with the four word lines WL0 to WL3. The output of the row driver 211-1 is connected with the four word lines WL4 to WL7.

Figure 15:
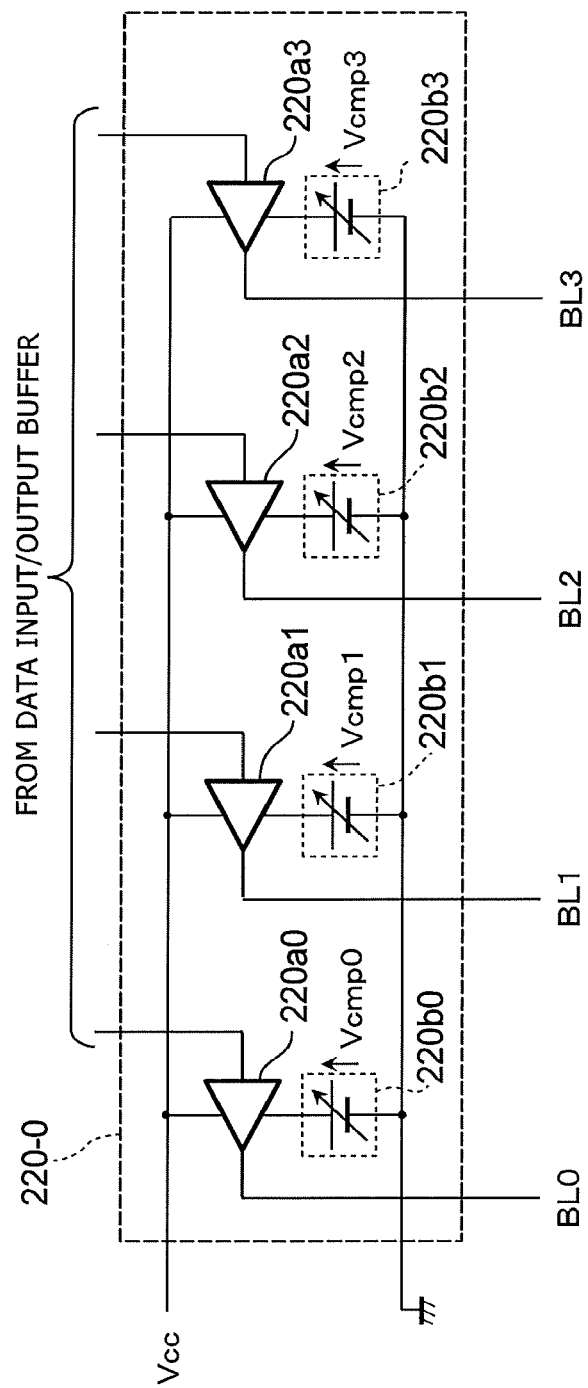
FIG. 15 is a schematic circuit diagram showing a circuit example of the column driver.

FIG. 15 is a schematic circuit diagram showing a circuit example of the column driver 220-0. It should be noted that the column driver 220-1 has, for example, substantially the same circuit configuration as that of the circuit example shown in FIG. 15.

In the second embodiment, the semiconductor layers 310 provided with the memory strings MS0 to MS7, . . . are formed using, for example, the "double sidewall forming method." Therefore, as shown in FIG. 15, the column driver 220-0 includes the four drivers 220a0 to 220a3, and the four compensation voltage generating circuit 220b0 to 220b3. The compensation voltage generating circuits 220b0 to 220b3 supply the compensation voltages Vcmp0 to Vcmp3 to, for example, the low potential-side power supply terminals of the drivers 220a0 to 220a3, respectively. It is also possible for the compensation voltage generating circuits 220b0 to 220b3 to supply the ground potential GND to, for example, the low potential-side power supply terminals of the drivers 220a0 to 200a3, respectively. The outputs of the drivers 220a0 to 220a3 are connected respectively to the bit lines BL0 to BL3. The drivers 220a0 to 220a3 supply the bit lines BL0 to BL3 with the compensation voltages Vcmp0 to Vcmp3, respectively, or the ground potential GND when, for example, performing the program operation or performing the weak program operation. It is possible to individually set the values of the compensation voltages Vcmp0 to Vcmp3, respectively. In the second embodiment, such column drivers 220 (220-0, 220-1, . . . ) are provided to every four bit lines BL repeatedly.

Figure 16:
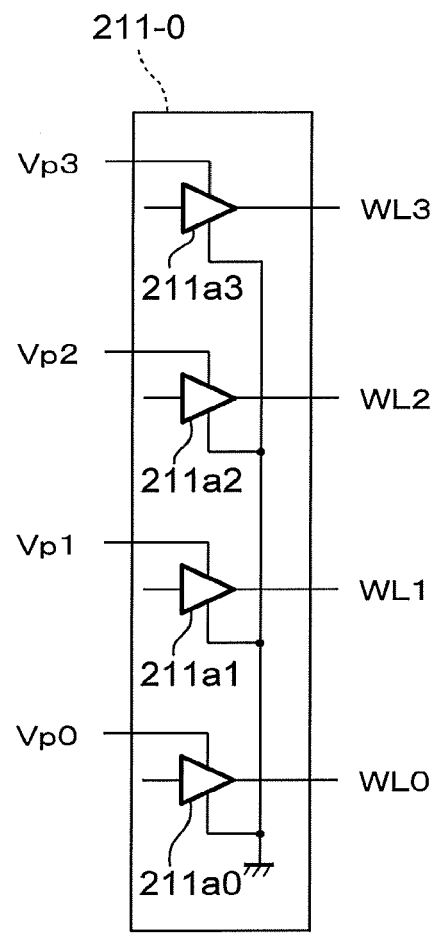
FIG. 16 is a schematic circuit diagram showing a circuit example of the row driver.

FIG. 16 is a schematic circuit diagram showing a circuit example of the row driver 211-0. It should be noted that the row driver 211-1 has, for example, substantially the same circuit configuration as that of the circuit example shown in FIG. 16.

In the second embodiment, the word lines WL0 to WL7 are also formed using, for example, the "double sidewall forming method." Therefore, as shown in FIG. 16, the row driver 211-0 is supplied with four pump voltages Vp0 to Vp3. The pump voltages Vp0 to Vp3 are supplied to, for example, high potential-side power supply terminals of the drivers 211a0 to 211a3. The outputs of the drivers 211a0 to 211a3 are connected respectively to the word lines WL0 to WL3. The drivers 211a0 to 211a3 supply the word lines WL0 to WL3 with the pump voltages Vp0 to Vp3, respectively, as the program voltage Vpgm or the weak program voltage Vwpgm when, for example, performing the program operation or performing the weak program operation. It is possible to individually set the values of the pump voltages Vp0 to Vp3, respectively. The pump voltages Vp0 to Vp3 are generated by, for example, the voltage generating circuit 208 shown in FIG. 1. In the second embodiment, such row drivers 211 (211-0, 211-1, . . . ) are provided to every four word lines WL repeatedly.

In the second embodiment, the values of the compensation voltages Vcmp0 to Vcmp3 and the values of the pump voltages Vp0 to Vp3 are set in, for example, a following manner.

<Compensation Voltages Vcmp0 to Vcmp3>

The compensation voltages Vcmp0 to Vcmp3 are set in accordance with, for example, the width $W_{310X}$ in the X-direction of the semiconductor layer 310 shown in FIG. 9A and FIG. 9B.

For example, in the case in which the width $W_{310X}$ is as large as the width $W_{310XW}$ as shown in FIG. 13, the values of the compensation voltages Vcmp0 to Vcmp3 are set to low levels. In contrast, in the case in which the width $W_{310X}$ is as narrow as the width $W_{310XN}$, the values of the compensation voltages Vcmp0 to Vcmp3 are set to high levels. In other words, the narrower the width $W_{310X}$ in the X-direction of the semiconductor layers 310 becomes, the higher the values of the compensation voltages Vcmp0 to Vcmp3 are set.

<Pump Voltages Vp0 to Vp3>

The values of the pump voltages Vp0 to Vp3 are set in accordance with, for example, the width $W_{320SY}$ in the Y-direction between the word lines WL (the word lines are denoted by the reference numeral 320 in FIG. 9A and FIG. 9C) shown in FIG. 9A and FIG. 9C.

For example, in the case in which the width $W_{320SY}$ is as large as the width $W_{320SYW}$ as shown in FIG. 12, the values of the pump voltages Vp0 to Vp3 are set to low levels. In contrast, in the case in which the width $W_{320SY}$ is as narrow as the width $W_{320SYN}$, the values of the pump voltages Vp0 to Vp3 are set to high levels. In other words, the narrower the width $W_{320SY}$ in the Y-direction between the word lines WL becomes, the higher the values of the pump voltages Vp0 to Vp3 are set.

It is possible to set the values of the pump voltages Vp0 to Vp3 in accordance with the capacitance on the periphery of the word line WL. For example, in the case in which the capacitance on the periphery of the word line WL is low, the values of the pump voltages Vp0 to Vp3 are set to low levels. In contrast, in the case in which the capacitance is high, the values of the pump voltages Vp0 to Vp3 are set to high levels. It is also possible to arrange that the higher the capacitance on the periphery of the word line WL becomes, the higher the values of the pump voltages Vp0 to Vp3 are set.

It is possible to set the values of the pump voltages Vp0 to Vp3 in accordance with the CR time constant of the word line WL. For example, in the case in which the CR time constant of the word line WL is low, the values of the pump voltages Vp0 to Vp3 are set to low levels. In contrast, in the case in which the CR time constant is high, the values of the pump voltages Vp0 to Vp3 are set to high levels. It is also possible to arrange that the higher the CR time constant of the word line WL becomes, the higher the values of the pump voltages Vp0 to Vp3 are set.

In the data erasure of the semiconductor device of the second embodiment, the weak program operation is performed on the memory cells MC after the batch erasure. The flow of the weak program operation is substantially the same as in the case of the first embodiment. In the second embodiment, in the weak program operation, the compensation voltages Vcmp0 to Vcmp3 to be applied to the bit lines BL, and the weak program voltages Vwpgm (the pump voltages Vp0 to Vp3) to be applied to the word lines WL are set in accordance with the items (1) to (4) described below.

Compensation voltages Vcmp0 to Vcmp3: (1) The narrower the width $W_{310X}$ in the X-direction of the semiconductor layers 310 becomes, the higher the compensation voltages Vcmp0 to Vcmp3 are set.

Weak program voltages Vwpgm (the pump voltages Vp0 to Vp3):

(2) The narrower the width $W_{320SY}$ in the Y-direction between the word lines WL becomes, the higher the weak program voltages Vwpgm are set.

(3) The higher the capacitance on the periphery of the word line WL becomes, the higher the weak program voltages Vwpgm are set.

(4) The higher the CR time constant of the word line WL becomes, the higher the weak program voltages Vwpgm are set.

According to the semiconductor device of the second embodiment, similarly to the first embodiment, the distribution width of the threshold voltage after the data erasure, for example, can be made narrower compared to the case in which the voltages to be applied to the bit lines BL in the weak program-selected state, or the weak program voltages Vwpgm are not controlled.

As described hereinabove, according to the first and second embodiments, it is possible to provide the semiconductor device and the operating method of the semiconductor device in which the influence of the variation in the memory cell MC structure is suppressed to improve the operation stability.

The embodiments are hereinabove described. However, the embodiment is not limited to the examples described above. For example, although in the second embodiment, there is described the example of using the "double sidewall forming method," the embodiment is not limited to the "double sidewall forming method." For example, it is also possible to use a "single sidewall forming method," and it is also possible to use a "triple sidewall forming method." It is obviously possible to use a quadruple or more sidewall forming method.

For example, in the case of using the "single sidewall forming method," the difference in the program/erasing speed periodically occurs with every two semiconductor layers 310 as one group, and/or every two word lines 320 as one group. In this case, it is sufficient for the column control circuit 201 to be configured so as to control the bit lines BL while setting every two bit lines BL as one group. Similarly, it is sufficient for the row control circuit 202 to be configured so as to control the word lines WL while setting every two word lines WL as one group.

In the case of using the "triple sidewall forming method," the difference in the program/erasing speed periodically occurs with every eight semiconductor layers 310 as one group, and/or every eight word lines 320 as one group. Therefore, it is sufficient for the column control circuit 201 to be configured so as to control the bit lines BL while setting every eight bit lines BL as one group, and it is sufficient for the row control circuit 202 to be configured so as to control the word lines WL while setting every eight word lines WL as one group.

Further, the first and second embodiments capable of narrowing the width of the threshold voltage distribution after erasing are particularly effective for, for example, the multi-level memory for storing more than two values of information in one memory cell MC.

The embodiments of the invention are hereinabove described with reference to the examples. However, the embodiment is not limited to the examples described above, and the examples described above are not solitary. The embodiments can also be applied to a planar-type memory device.

Further, the embodiment capable of suppressing the rise in threshold voltage of the memory cell MC due to the difference in voltage waveform when performing the program is effective for the multi-level memory for storing more than two values of information in one memory cell MC.

Further, the invention is not limited to these examples. For example, the specific configurations of the elements such as the first memory cell, the second memory cell, the first word line, the first bit line, the second bit line, the source line and the row control circuit are included in the scope of the invention as long as it is possible for those skilled in the art to similarly implement the invention and obtain similar advantages by appropriately selecting such configurations from a range known to the public.

Those obtained by combining any two or more elements in the examples with each other within a technically achievable range are also included in the scope of the invention as long as the subject matter of the invention is included.

All of the semiconductor devices, which can be implemented by those skilled in the art with appropriate design changes based on the semiconductor devices described above as the embodiments of the invention, belong to the scope of the invention as long as the subject matter of the invention is included.

Those skilled in the art can conceive a variety of variations and modifications within the range of the concept of the invention, and it is acknowledged that such variations and modifications also belong to the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
  a first memory cell having a first gate electrode, and a first channel having one end and another end;
  a second memory cell having a second gate electrode, and a second channel having one end and another end;
  a first word line electrically connected with each of the first gate electrode and the second gate electrode;
  a first bit line electrically connected with the one end of the first channel;
  a second bit line electrically connected with the one end of the second channel;
  a source line electrically connected with each of the other end of the first channel and the other end of the second channel; and
  a row control circuit adapted to supply the first word line with a voltage,
  wherein the semiconductor device erases data of each of the first memory cell and the second memory cell, and then
  shifts respective threshold voltages of the first memory cell and the second memory cell while making a first voltage between the first gate electrode and the first channel, and a second voltage between the second gate electrode and the second channel, the first voltage being different from the second voltage.

2. The device according to claim 1, wherein
  the threshold voltage is shifted within a threshold voltage range in a erasing state.

3. The device according to claim 1, wherein
  the first memory cell includes a first columnar section provided in the first word line, extending in a first direction, and including the first channel,
  the second memory cell includes a second columnar section provided in the first word line, extending in the first direction, and including the second channel,
  an area of a cross-section crossing the first direction of the first columnar section is smaller than an area of the cross-section of the second columnar section, and
  the first voltage is lower than the second voltage.

4. The device according to claim 1, further comprising:
  a third memory cell provided so as to be stacked on the first memory cell, the third memory cell having a third gate electrode and a third channel having one end and the other end, the third channel being connected in series between the first channel and the first bit line; and a second word line connected with the third gate electrode, wherein data of each of the first to third memory cells is erased, and then a threshold voltage of the third memory cell is shifted while making a third voltage between the third gate electrode and a channel of the third memory cell different from the first voltage.

5. The device according to claim 4, wherein in a case in which the third memory cell is stacked in an upper layer of the first memory cell, the third voltage is higher than the first voltage.

6. The device according to claim 1, further comprising:

a fourth memory cell having a fourth gate electrode, and a fourth channel having one end and another end;

a fifth memory cell having a fifth gate electrode, and a fifth channel having one end and another end;

a third bit line electrically connected with the one end of the fourth channel; and a fourth bit line electrically connected with the one end of the fifth channel, wherein data of each of the first, second, fourth, and fifth memory cells is erased, and then respective threshold voltages of the fourth memory cell and the fifth memory cell are shifted while making at least one of a fourth voltage between the fourth gate electrode and the fourth channel and a fifth voltage between the fifth gate electrode and the fifth channel different from the first voltage.

7. The device according to claim 6, wherein values of the first, second, fourth and fifth voltages are set based on at least one of program speeds and erasing speeds of the first, second, fourth, and fifth memory cells.

8. The device according to claim 1, wherein an operation of shifting the respective threshold voltages of the first memory cell and the second memory cell is a weak program operation.

9. A semiconductor device comprising:

a first memory cell having a first gate electrode, and a first channel having one end and another end;

a second memory cell having a second gate electrode, and a second channel having one end and another end;

a first word line connected with each of the first gate electrode and the second gate electrode;

a first bit line electrically connected with the one end of the first channel;

a second bit line electrically connected with the one end of the second channel;

a source line electrically connected with each of the other end of the first channel and the other end of the second channel;

a row control circuit including a row driver connected with the first word line;

a column control circuit, the column control circuit including a first circuit connected with the first bit line and a second circuit connected with the second bit line, the first circuit including a first driver and a compensation voltage generating circuit connected in series between a power supply voltage and a ground voltage, an output of the first driver being connected with the first bit line, and an output of the compensation voltage generating circuit being connected with a ground potential-side power supply terminal of the first driver; and a state machine configured to execute an operation of erasing data of each of the first memory cell and the second memory cell, and then shifting the respective threshold voltages of the first memory cell and the second memory cell while making a first voltage between the first gate electrode and the channel and a second voltage between the second gate electrode and the second channel, the first voltage being different from the second voltage.

10. The device according to claim 9, wherein the first memory cell includes a first columnar section provided in the first word line, extending in a first direction, and including the first channel, the second memory cell includes a second columnar section provided in the first word line, extending in the first direction, and including the second channel, and an area of a cross-section crossing the first direction of the first columnar section is smaller than an area of the cross-section of the second columnar section.

11. The device according to claim 10, wherein data of each of the first memory cell and the second memory cell is erased, and then a potential of the first bit line is made higher than a potential of the second bit line to shift respective threshold voltages of the first memory cell and the second memory cell.

12. An operating method of the device according to claim 1, comprising:

erasing data of each of the first memory cell and the second memory cell; and shifting the respective threshold voltages of the first memory cell and the second memory cell while making a first voltage between the first gate electrode and the first channel and a second voltage between the second gate electrode and the second channel, the first voltage being different from the second voltage.

13. The method according to claim 12, wherein the threshold voltage is shifted within a threshold voltage range in an erasing state.

14. The method according to claim 12, wherein the shifting the respective threshold voltages is a weak program operation.

* * * * *